(12) United States Patent
Liaw

(10) Patent No.: US 9,312,265 B2
(45) Date of Patent: Apr. 12, 2016

(54) APPARATUS FOR HIGH SPEED ROM CELLS

(71) Applicant: Taiwan Semiconductor Manufacturing Company, Ltd., Hsin-Chu (TW)

(72) Inventor: Jhon-Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 48 days.

(21) Appl. No.: 14/263,634

(22) Filed: Apr. 28, 2014

(65) Prior Publication Data

US 2014/0231921 A1 Aug. 21, 2014

Related U.S. Application Data

(62) Division of application No. 13/436,452, filed on Mar. 30, 2012, now Pat. No. 8,743,580.

(51) Int. Cl.
| | |
|---|---|
| *G11C 5/02* | (2006.01) |
| *H01L 27/112* | (2006.01) |
| *G11C 17/08* | (2006.01) |
| *G11C 11/412* | (2006.01) |
| *H01L 29/78* | (2006.01) |
| *G11C 5/06* | (2006.01) |
| *H01L 27/02* | (2006.01) |

(52) U.S. Cl.
CPC ............ *H01L 27/11213* (2013.01); *G11C 5/06* (2013.01); *G11C 11/412* (2013.01); *G11C 17/08* (2013.01); *H01L 27/1124* (2013.01); *H01L 29/785* (2013.01); *G11C 5/02* (2013.01); *G11C 5/063* (2013.01); *H01L 27/0207* (2013.01); *H01L 2029/7858* (2013.01)

(58) Field of Classification Search
CPC ........ G11C 5/02; G11C 5/06; H01L 27/0207; H01L 2029/7858
USPC ...................................................... 365/51, 63
See application file for complete search history.

(56) References Cited

U.S. PATENT DOCUMENTS

| | | | |
|---|---|---|---|
| 6,285,088 B1 * | 9/2001 | Madan | ................ H01L 27/1112 257/202 |
| 6,417,032 B1 * | 7/2002 | Liaw | ................... H01L 27/1104 257/903 |

(Continued)

FOREIGN PATENT DOCUMENTS

| | | |
|---|---|---|
| JP | 2005117037 A | 4/2005 |
| JP | 2005328052 A | 11/2005 |
| KR | 1020090120937 A | 11/2009 |

*Primary Examiner* — Viet Q Nguyen
(74) *Attorney, Agent, or Firm* — Slater & Matsil, L.L.P.

(57) ABSTRACT

A ROM cell comprises a first first-level contact formed on a first active region of a transistor of a memory cell, a second first-level contact formed on a second active region of the transistor of the memory cell, wherein the second first-level contact is coupled to a first VSS line and a second VSS line formed in a first interconnect layer, wherein the second VSS line is electrically coupled to the first VSS line, and wherein the second VSS line is of a direction orthogonal to a direction of the first VSS line. The ROM cell further comprises a first bit line formed in the first interconnect layer, wherein the first bit line is formed in parallel with the second VSS line and a second bit line formed in the first interconnect layer, wherein the second bit line is formed in parallel with the second VSS line.

20 Claims, 22 Drawing Sheets

(56) References Cited

U.S. PATENT DOCUMENTS

| | | |
|---|---|---|
| 6,760,251 B2 | 7/2004 | Hidaka |
| 6,850,427 B1 | 2/2005 | Prestwich |
| 6,934,182 B2 | 8/2005 | Chan et al. |
| 7,176,125 B2 * | 2/2007 | Liaw .................. H01L 27/1104 257/368 |
| 7,277,339 B2 | 10/2007 | Edahiro |
| 7,394,155 B2 * | 7/2008 | Liaw ................. H01L 21/76895 257/758 |
| 7,514,737 B2 | 4/2009 | Yokoyama |
| 7,535,752 B2 * | 5/2009 | Kawasumi ........... G11C 11/412 365/154 |
| 7,643,345 B2 | 1/2010 | Ishibashi |
| 7,679,108 B2 | 3/2010 | Matsunaga et al. |
| 7,701,767 B2 * | 4/2010 | Chu .................... H01L 27/0207 257/316 |
| 7,940,542 B2 | 5/2011 | Funane et al. |
| 7,973,371 B2 | 7/2011 | Furuta et al. |
| 8,009,463 B2 * | 8/2011 | Liaw ........................ G11C 8/16 365/154 |
| 8,120,939 B2 | 2/2012 | Liaw |
| 8,129,771 B2 | 3/2012 | Yokoyama |
| 8,169,824 B2 | 5/2012 | Endo et al. |
| 8,189,368 B2 * | 5/2012 | Liaw .................... G11C 11/412 365/154 |
| 8,253,182 B2 | 8/2012 | Kajimoto et al. |
| 8,338,882 B2 | 12/2012 | Tanaka et al. |
| 8,400,832 B2 | 3/2013 | Endo |
| 8,750,011 B2 * | 6/2014 | Liaw ...................... G11C 17/12 257/700 |
| 8,947,902 B2 * | 2/2015 | Liaw .................... G11C 11/412 365/63 |
| 2004/0023449 A1 * | 2/2004 | Hsu ........................ H01L 27/11 438/152 |
| 2005/0247981 A1 | 11/2005 | Wang |
| 2009/0059640 A1 * | 3/2009 | Funane ................. G11C 7/1075 365/51 |
| 2011/0069527 A1 | 3/2011 | Liaw |
| 2011/0157965 A1 * | 6/2011 | Nii ...................... G11C 11/4125 365/156 |

\* cited by examiner

| Cell-1 Data: 1 | Cell-2 Data: 1 | Cell-3 Data: 0 | Cell-4 Data: 1 | Cell-5 Data: 1 |
| --- | --- | --- | --- | --- |
| Cell-6 Data: 0 | Cell-7 Data: 1 | Cell-8 Data: 1 | Cell-9 Data: 1 | Cell-10 Data: 1 |
| Cell-11 Data: 1 | Cell-12 Data: 0 | Cell-13 Data: 0 | Cell-14 Data: 1 | Cell-15 Data: 1 |

| Cell-1<br>Data: 1 | Cell-2<br>Data: 1 | Cell-3<br>Data: 0 | Cell-4<br>Data: 1 | Cell-5<br>Data: 1 |
|---|---|---|---|---|
| Cell-6<br>Data: 0 | Cell-7<br>Data: 1 | Cell-8<br>Data: 1 | Cell-9<br>Data: 1 | Cell-10<br>Data: 1 |
| Cell-11<br>Data: 1 | Cell-12<br>Data: 0 | Cell-13<br>Data: 0 | Cell-14<br>Data: 1 | Cell-15<br>Data: 1 |

APPARATUS FOR HIGH SPEED ROM CELLS

PRIORITY CLAIM AND CROSS-REFERENCE

This application is a divisional of U.S. patent application Ser. No. 13/436,452, entitled "Apparatus for High Speed ROM Cells," filed on Mar. 30, 2012, which application is incorporated herein by reference.

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as read-only-memory (ROM), electrically erasable programmable read-only memory (EEPROM) and flash memory.

ROM is a type of solid state memory. Each ROM cell is fabricated with a desired logic state. In other words, a bit of binary data is permanently stored in a ROM cell either in a logic state of "0" or "1" depending on whether there is a conductive path between a bit line and a VSS line. In accordance with a definition of a ROM cell's logic, when a logic state of "1" is stored in a ROM cell, there is a connected path from a bit line to a VSS line. On the other hand, when a logic state of "0" is stored in a ROM cell, there is no connected path from the bit line to the VSS line. The definition of "0" and "1" described above can be swapped depending on different applications.

As technologies evolve, semiconductor process nodes have been scaled down for high density ROM integrated circuits. As a result, the form factor of ROM integrated circuit has been improved from shrinking the semiconductor process node (e.g., shrink the process node towards the sub-20 nm node). As semiconductor devices are scaled down, new techniques are needed to maintain the electronic components' performance from one generation to the next. For example, low leakage current transistors are desirable for high density and high speed ROM integrated circuits.

Fin field-effect transistors (FinFETs) have emerged as an effective alternative to further reduce leakage current in semiconductor devices. In contrast to the prior planar MOS transistor, which has a channel formed at the surface of a semiconductor substrate, a FinFET has a three dimensional channel region. In a FinFET, an active region including the drain, the channel region and the source protrudes up from the surface of the semiconductor substrate upon which the FinFET is located. The active region of the FinFET, like a fin, is rectangular in shape from a cross section view. In addition, the gate structure of the FinFET wraps the active region around three sides like an upside-down U. As a result, the gate structure's control of the channel has become stronger. The short channel leakage effect of conventional planar transistors has been reduced. As such, when the FinFET is turned off, the gate structure can better control the channel so as to reduce leakage current.

The three-dimensional shape of the FinFET channel region allows for an increased gate width without increased silicon area even as the overall scale of the devices is reduced with semiconductor process scaling, and in conjunction with a reduced gate length, providing a reasonable channel width characteristic at a low silicon area cost.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 18 illustrates the logic state of each ROM cell of the ROM array shown in FIG. 17;

FIG. 22 illustrates the logic state of each ROM cell of the ROM array shown in FIG. 21.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, apparatus for high density and high speed read-only-memory (ROM) array to be fabricated within an integrated circuit. The embodiments of the disclosure may also be applied, however, to a variety of memory circuits. Hereinafter, various embodiments will be explained in detail with reference to the accompanying drawings.

Figure 1:
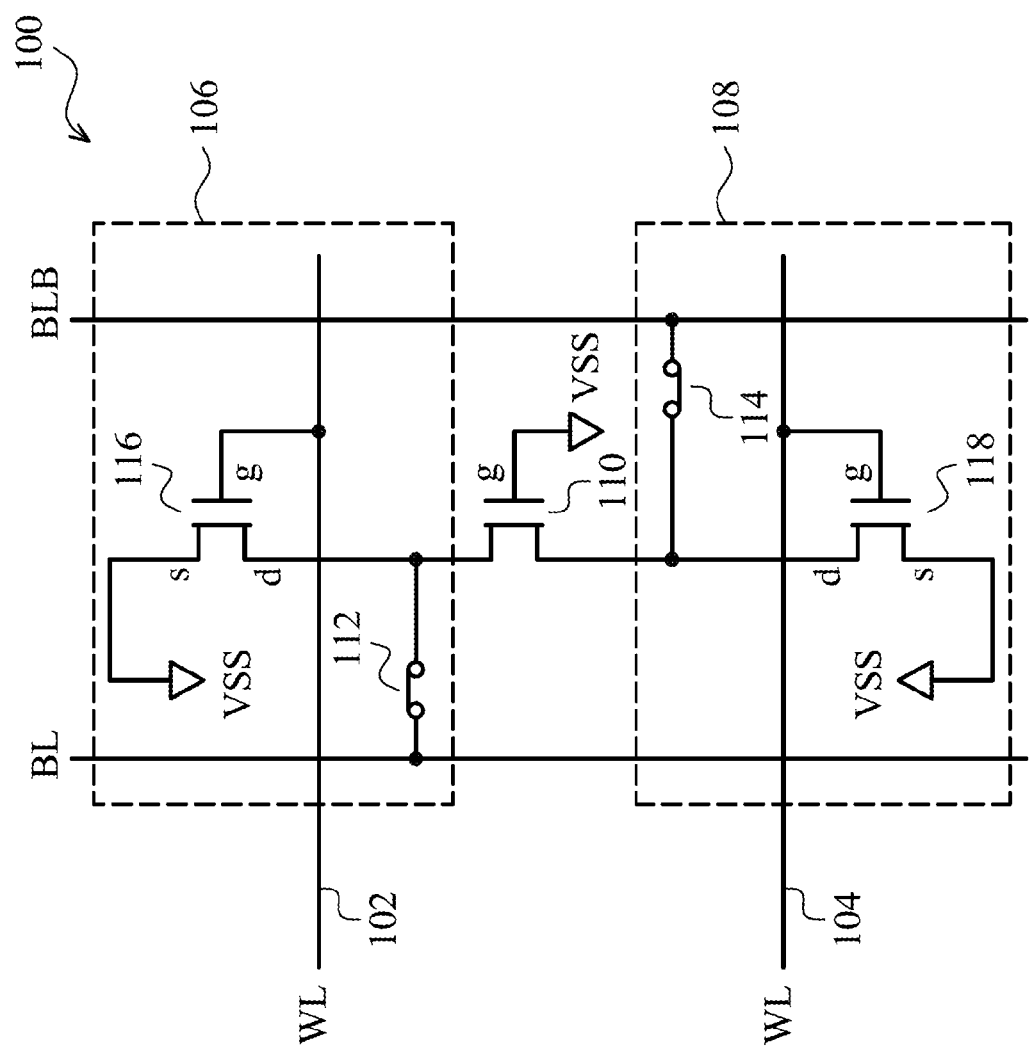
FIG. 1 illustrates a schematic diagram of a read-only-memory (ROM) cell using differential sensing in accordance with an embodiment.

FIG. 1 illustrates a schematic diagram of a ROM cell using differential sensing in accordance with an embodiment. The ROM cell array 100 comprises a first ROM cell 106 and a second ROM cell 108. There is an isolation transistor 110 coupled between the first ROM cell 106 and the second ROM cell 108. In accordance with an embodiment, the isolation transistor 110 is an n-type metal oxide semiconductor (NMOS) transistor. In addition, the isolation transistor 110 may be an NMOS transistor having a fin structure protruding over surface of the semiconductor substrate and a gate wrapping the fin structure around the three sides of the fin structure.

As shown in FIG. 1, the gate of the isolation transistor 110 is coupled to a ground potential. As a result, the isolation transistor 110 is in a turn-off state. Throughout the description, the ground potential is alternatively referred to as a VSS line. The isolation transistor 110 does not provide any electrical function. Instead, the isolation transistor 110 provides an isolation barrier between two adjacent ROM cells (e.g., ROM cell 106 and ROM cell 108) of the ROM cell array 100. Such an isolation barrier prevents active current flowing between two adjacent ROM cells (e.g., ROM cells 106 and 108) so that two adjacent ROM cells can share a continuous active region.

The ROM array 100 is coupled to a differential bit line pair, namely a bit line BL and its inverse BLB. In accordance with an embodiment, when a ROM cell is coupled to the bit line BL, the ROM cell is programmed with a logic state of "1". On the other hand, a ROM cell coupled to BLB is programmed with a logic state of "0" because the bit line BLB is an inverse of the bit line BL. It should be noted that a person skilled in the art will recognize that according to another embodiment, the logic states of ROM cells can be reversed depending on different application conditions. For example, by employing a different definition, the connection to the bit line BLB and the connection to the bit line BL may represent a logic state of "1" and a logic state of "0" respectively.

The first ROM cell 106 comprises a pass transistor 116. The pass transistor 116 may be an NMOS transistor having a fin structure protruding over surface of the semiconductor substrate and a gate wrapping the fin structure around the three sides of the fin structure. Alternatively, the pass transistor 116 may be formed by a plurality of FinFETs connected in parallel. The second ROM cell 108 comprises a pass transistor 118. The pass transistor 118 may be an NMOS transistor having a fin structure protruding over surface of the semiconductor substrate and a gate wrapping the fin structure around the three sides of the fin structure. Alternatively, the pass transistor 118 may be formed by a plurality of FinFETs connected in parallel.

The pass transistor 116 of the first ROM cell 106 has a drain coupled to the bit line BL through a first connection structure 112, a gate coupled to a first word line 102 and a source coupled to a VSS line. According to the fabrication process of ROM cells, the first connection structure 112 may be implemented by a coding layer. The detailed description of the coding layer will be discussed below with respect to FIG. 6. As shown in FIG. 1, the first ROM cell 106 is programmed with a logic state of "1" since the drain of the first ROM cell 106 is coupled to the bit line BL. In response to a READ signal applied to the first word line 102, there is a voltage variation can be read out from the bit line BL because the turned on pass transistor 116 may pull down the bit line voltage toward a ground potential. The variation of the bit line voltage indicates that a logic state of "1" is stored in the first ROM cell 106.

The second ROM cell 108 has a drain coupled to the bit line BLB through a second connection structure 114, a gate coupled to a second word line 104 and a source coupled to VSS. According to the fabrication process of ROM cells, the second connection structure 114 may be implemented by a coding layer. As shown in FIG. 1, the second ROM cell 108 is programmed with a logic state of "0" since the drain of the first ROM cell 108 is coupled to the bit line BLB. In response to a READ signal applied to the first word line 102, there is a voltage variation can be read out from the bit line BLB because the turned on pass transistor 118 may pull down the bit line voltage of BLB toward a ground potential. The voltage variation at the bit line BLB indicates that a logic state of "0" is stored in the first ROM cell 108.

In sum, the ROM cell array 100 shown in FIG. 1 comprises three transistors, namely the first pass transistor 116 of the first ROM cell 106, the isolation transistor 110 and the second pass transistor 118 of the second ROM cell 108. Each transistor can be implemented by a planar transistor. As technologies evolve, semiconductor process nodes have been scaled down to a sub-20 nm level. Low leakage current transistors are an effective alternative to further improve the performance of ROM integrated circuits. As a consequence, the transistors shown in FIG. 1 may be implemented by FinFETs.

Figure 2:
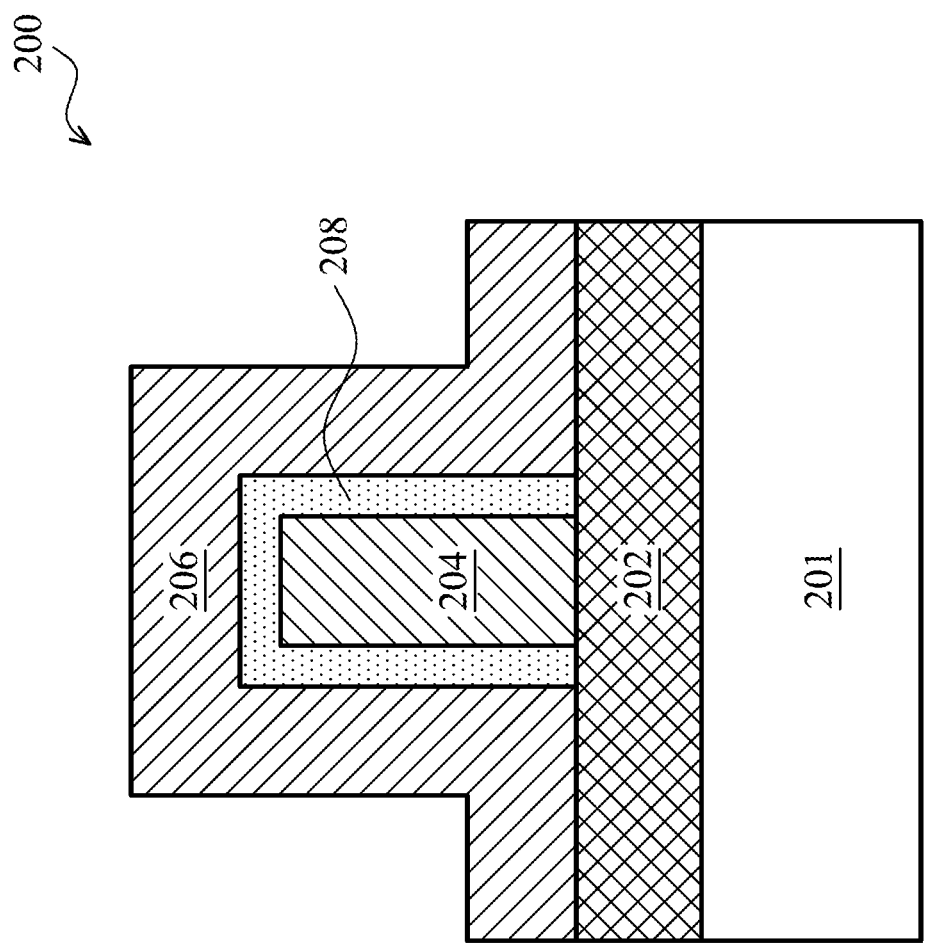
FIG. 2 illustrates a cross sectional view of a fin field effect transistor (FinFET) in accordance with an embodiment.

FIG. 2 illustrates a cross sectional view of a fin field effect transistor (FinFET) in accordance with an embodiment. The FinFET 200 is of a silicon-on-insulator (SOI) FinFET structure. In the FinFET 200, an active region 204 includes a drain, a source and a channel region coupled between the drain and the source. The active region 204 protrudes up from the surface of the semiconductor substrate 201 upon which the FinFET is located. The active region 204 of the FinFET 200, like a fin, is rectangular in shape from a cross section view. In addition, the gate structure 206 of the FinFET 200 wraps the active region 204 around three sides like an upside-down U.

In accordance with an embodiment, the FinFET 200 comprises a substrate 201 and an SOI layer 202 formed over the substrate 201. In other words, the substrate 201 and the SOI layer 202 form an SOI substrate. In accordance with an embodiment, the SOI layer 202 is formed of silicon dioxide. The substrate 201 may be formed of silicon, although it may also be formed of other group III, group IV, and/or group V elements, such as silicon, germanium, gallium, arsenic, and combinations thereof. In accordance with an embodiment, the substrate 201 may be a lightly doped n-type substrate, which is formed by implanting n-type dopants such as phosphorous at a concentration of between about $5 \times 10^{16}/cm^3$ and about $9 \times 10^{18}/cm^3$.

As shown in FIG. 2, there may be a gate dielectric layer 208 formed between the active region 204 and the gate structure 206. The gate dielectric layer 208 may be formed of oxide materials and formed by suitable oxidation processes such as wet or dry thermal oxidation, sputtering or by CVD techniques using tetra-ethyl-ortho-silicate (TEOS) and oxygen as a precursor. In addition, the gate dielectric layer 208 may be a high-K dielectric material (K>10), such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like.

The gate structure 206 may comprise a conductive material selected from a group comprising of polycrystalline-silicon (poly-Si), poly-crystalline silicon-germanium (poly-SiGe), metal materials, metal silicide materials, metal nitride materials, metal oxide materials and the like. For example, metal materials may include tantalum, titanium, molybdenum, tungsten, platinum, aluminum, hafnium, ruthenium, a combination thereof and the like. Metal silicide materials include titanium silicide, cobalt silicide, nickel silicide, tantalum silicide, a combination thereof and the like. Metal nitride materials include titanium nitride, tantalum nitride, tungsten nitride, a combination thereof and the like. Metal oxide materials include ruthenium oxide, indium tin oxide, a combination thereof and the like.

It should be noted that other fabrication processes may be used to form the gate structure 206. Other fabrication processes include but is not limited to CVD, physical vapor deposition (PVD), plasma enhanced CVD (PECVD), atmospheric pressure CVD (APCVD), high density plasma CVD (HD CVD), low-pressure chemical vapor deposition (LPCVD), atomic layer CVD (ALCVD) and the like.

Figure 3:
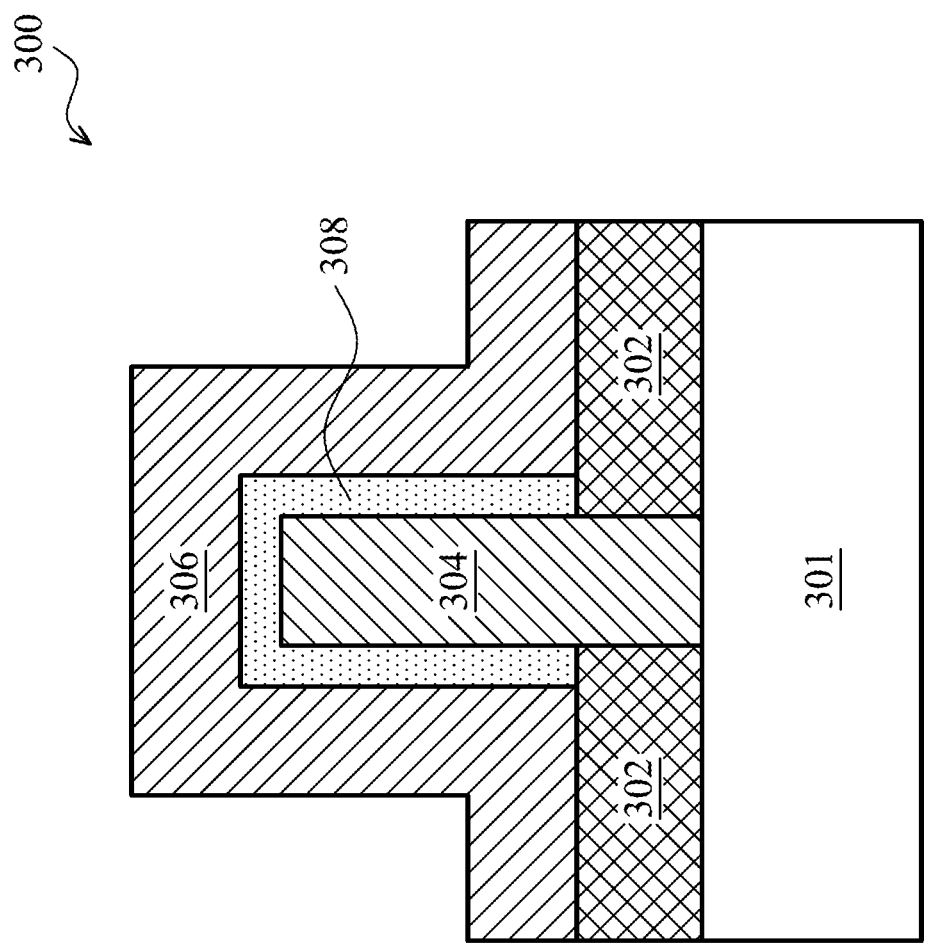
FIG. 3 illustrates a cross sectional view of a FinFET in accordance with another embodiment.

FIG. 3 illustrates a cross sectional view of a fin field effect transistor (FinFET) in accordance with another embodiment. The FinFET 300 is of a bulk FinFET structure. The gate 306, the gate dielectric layer 308 and the active region 304 are similar to those shown in FIG. 2, and hence are not discussed in further detail herein. In accordance with an embodiment, the substrate 301 may be a crystalline structure. The substrate 301 may be formed of silicon, although it may also be formed of other group III, group IV, and/or group V elements, such as silicon, germanium, gallium, arsenic, and combinations thereof.

In accordance with an embodiment, the FinFET 300 may comprise an isolation region 302. As shown in FIG. 3, the bottom portion of the active region 304 is enclosed by the isolation region 302. The isolation region 302 may be implemented by an STI structure. The STI structure (e.g., isolation region 302) may be fabricated by using suitable techniques including photolithography and etching processes. In particular, the photolithography and etching processes may comprise depositing a commonly used mask material such as photoresist over the substrate 301, exposing the mask material to a pattern, etching the substrate 301 in accordance with the pattern. In this manner, a plurality of openings may be formed as a result. The openings are then filled with dielectric materials to form the STI structures (e.g., isolation regions 302). In accordance with an embodiment, the isolation regions may be filled with a dielectric material such as an oxide material, a high-density plasma (HDP) oxide or the like. A chemical mechanical polishing (CMP) process is then performed to remove excess portions of the dielectric materials, and the remaining portions are the isolation region 302.

As shown in FIG. 3, the isolation region 302 may be portions of a continuous region, which may form an isolation ring in accordance with an embodiment. Alternatively, the isolation region 302 may be two separate isolation regions having their sidewalls facing each other.

Figure 4:
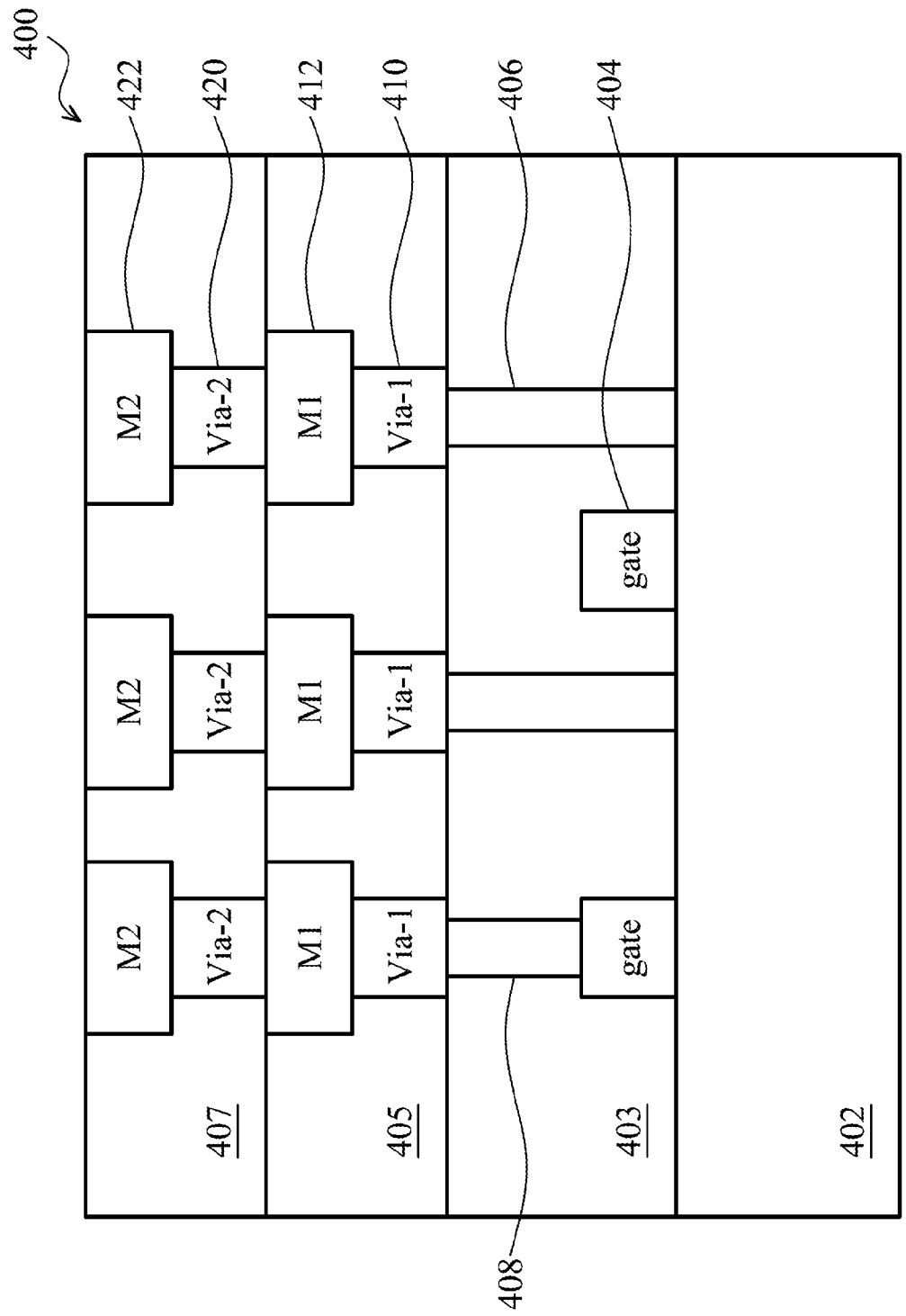
FIG. 4 illustrates a cross sectional view of a semiconductor device having a single contact structure in accordance with an embodiment.

FIG. 4 illustrates a cross sectional view of a semiconductor device having a single contact structure in accordance with an embodiment. The semiconductor device 400 includes a substrate 402 and a plurality of transistors (not shown) formed in the substrate. A gate 404 of a transistor is formed over the substrate 402. The gate 404 may comprise a gate electrode and a gate dielectric layer (not shown respectively).

As shown in FIG. 4, an inter-layer dielectric (ILD) layer 403 is formed over the substrate 402. The ILD layer 403 may comprise a material such as boron phosphorous silicate glass (BPSG), although any suitable dielectrics may be used for either layer. The ILD layer 403 may be formed using a process such as PECVD, although other processes, such as LPCVD, may alternatively be used.

There may be a plurality of contacts 406 and 408 coupled to the gate electrode 404 and other active regions such as a drain/source region (not shown). The contacts 406 and 408 may be formed through the ILD layer 403 with suitable photolithography and etching techniques. Generally, these photolithography techniques involve depositing a photoresist material, which is masked, exposed, and developed to expose portions of the ILD layer 403 that are to be removed. The remaining photoresist material protects the underlying material from subsequent processing steps, such as etching. The etching process may form trenches. The trenches may be filled with conductive materials to form contacts.

The contacts 406 and 408 may comprise a barrier/adhesion layer (not shown) to prevent diffusion and provide better adhesion for the contacts 406 and 408. In an embodiment, the barrier layer is formed of one or more layers of titanium, titanium nitride, tantalum, tantalum nitride, or the like. The barrier layer may be formed through chemical vapor deposition, although other techniques could alternatively be used.

The contacts 406 and 408 may be formed of any suitable conductive material, such as a highly-conductive, low-resistive metal, elemental metal, transition metal, or the like. In accordance with an embodiment, the contacts 406 and 408 are formed of tungsten, although other materials, such as Cu, Al, AlCu, TiN, TiW, Ti, TaN, Ta, Pt, or any combination thereof, could alternatively be utilized. In an embodiment in which the contacts 406 and 408 are formed of tungsten, the contacts 406 and 408 may be deposited by CVD techniques known in the art, although any method of formation could alternatively be used.

After the contacts 406 and 408 are formed, there may be a plurality of interconnect layers formed over the ILD layer 403. For simplicity, only two interconnect layers are illustrated to represent the inventive aspects of various embodiments. A first interconnect layer 405 is formed over the ILD layer 403. As shown in FIG. 4, the first interconnect layer 405 may comprise the first vias 410 and first metal lines 412. The first vias 410 and first metal lines 412 may be made through any suitable formation process (e.g., lithography with etching, damascene, dual damascene, or the like) and may be formed using suitable conductive materials such as copper, aluminum, aluminum alloys, copper alloys or the like.

A second interconnect layer 407 is formed over the first interconnect layer 405. The second interconnect layer 407 may include second vias 420 and second metal lines 422. In accordance with an embodiment, the second vias 420 and the second metal lines 422 are formed of conductive materials such as copper aluminum, aluminum alloys, copper alloys or the like. As shown in FIG. 4, the second metal lines 422 are electrically coupled to the first metal lines 412 through the second vias 420.

Figure 5:
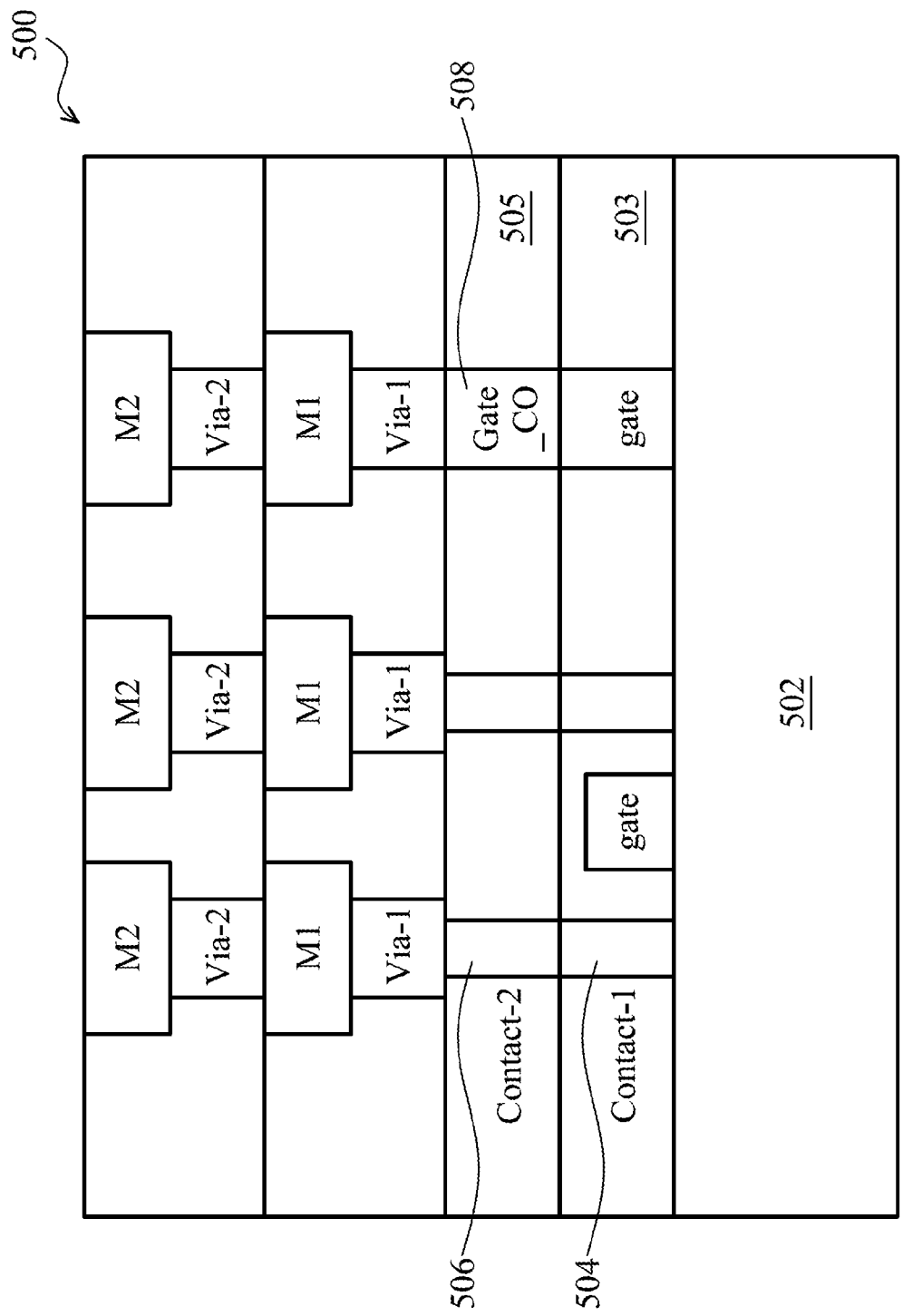
FIG. 5 illustrates a cross sectional view of a semiconductor device having a dual contact structure in accordance with an embodiment.

FIG. 5 illustrates a cross sectional view of a semiconductor device having a dual contact structure in accordance with an embodiment. The semiconductor device 500 are similar to the semiconductor device 400 expect that the semiconductor device 500 includes a dual contact structure. As shown in FIG. 5, there may be two contacts 504 and 506 electrically coupled to each other. In particular, the second-level contact 506 is formed over the first-level contact 504. Both the second-level contact 506 and the first-level contact 504 are formed in a first ILD layer 503. FIG. 5 also shows there may be a gate contact 508 formed between the gate and the first via.

As shown in FIG. 5, the first ILD layer 503 is deposited over the substrate 502. The first-level contact 504 may be formed through the first ILD layer 503 with suitable photolithography and etching techniques. Generally, these photolithography techniques involve depositing a photoresist material, which is masked, exposed, and developed to expose portions of the first ILD layer 503 that are to be removed. The remaining photoresist material protects the underlying material from subsequent processing steps, such as etching. The etching process may form trenches. The trenches may be filled with conductive materials to form the first-level contact 504.

After the first-level contact 504 has been formed, a second ILD layer 505 is deposited over the first ILD layer 503. The second-level contact 506 and the gate contact 508 may be formed through the second ILD layer 505 with suitable techniques similar to those employed in the formation of the first-level contact 504, and hence are not discussed in further detail to avoid unnecessary repetition.

Figure 6:
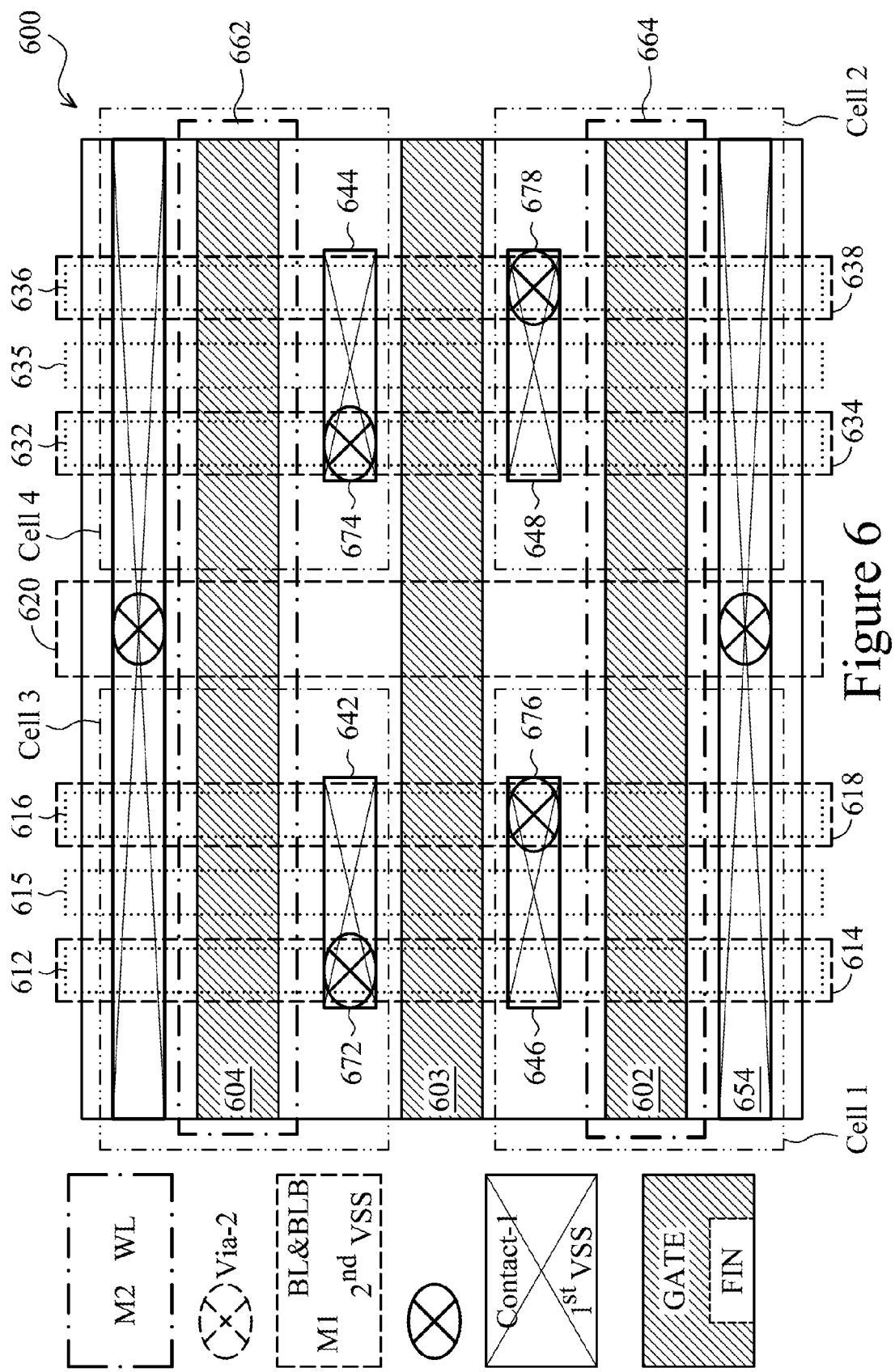
FIG. 6 illustrates a layout diagram of a ROM cell in accordance with an embodiment.

FIG. 6 illustrates a layout diagram of a ROM array in accordance with an embodiment. The ROM array 600 has two rows and two columns. As shown in FIG. 6, the ROM array 600 comprises four ROM cells, namely Cell 1, Cell 2, Cell 3 and Cell 4. The first column of the ROM array 600 comprises Cell 1 and Cell 3, which are formed by three active regions, namely active regions 612, 615 and 616. In accordance with an embodiment, the active regions 612, 615 and 616 are a fin shaped structure protruding over the surface of the semiconductor substrate. As shown in FIG. 6, the active region 612, the active region 615 and the active region 616 are formed in parallel.

The second column of the ROM array 600 comprises Cell 2 and Cell 4, which are formed by three active regions, namely active regions 632, 635 and 636. In accordance with an embodiment, the active regions 632, 635 and 636 are a fin shaped structure protruding over the surface of the semiconductor substrate. As shown in FIG. 6, the active region 632, active region 635 and active region 636 are formed in parallel. In addition, the active regions in the second column (e.g., active region 635) and the active regions in the first column (e.g., active region 615) are routed in parallel.

As shown in FIG. 6, there may be a VSS line 620 formed between the first column and the second column of the ROM array 600. Throughout the description, the VSS line 620 is alternatively referred to as the second VSS line 620. The second VSS line 620 is formed in a first interconnect layer. The ROM array 600 comprises first VSS lines formed in the first-level contact 652 and the first-level contact 654. Throughout the description, the first-level contacts 652 and 654 are alternatively referred to as the first VSS lines 652 and 654 respectively. The first VSS lines 652 and 654 are orthogonal to the second VSS line 620 and electrically coupled to the second VSS line 620.

The ROM array 600 comprises three gate regions, namely the first gate region 602, the second gate region 604 and the third gate region 603. As shown in FIG. 6, the first gate region 602 is formed in the first row of the ROM array 600. The second gate region 604 is formed in the second row of the ROM array 600. The third gate region 603 is formed between the first row and the second row of the ROM array 600. It should be noted that the third gate region 603 and the active regions adjacent to the third gate region 603 form two isolation transistors. The function and schematic diagram of the isolation transistor have described in detail with respect to FIG. 1, and hence are not discussed in further detail herein to avoid repetition.

As shown in FIG. 6, the first gate region 602, the second gate region 604 and the third gate region 603 are formed in parallel. In addition, the gate regions such as gate region 602 and the active regions such as the active region 612 are orthogonal to each other. A transistor is formed at the cross point of a gate region (e.g., gate region 602) and an active region (e.g., active region 612).

In accordance with an embodiment, a first pass transistor of Cell 1 is formed at the cross point of the first gate region 602 and the active region 612. The drain of the first pass transistor is connected to a first-level contact 646. In other words, the first-level contact 646 is formed upon the drain of the first pass transistor of Cell 1 and electrically coupled to the drain of the first pass transistor of Cell 1. The source of the first pass transistor is connected to a first-level contact 654, which is the first VSS line. In other words, the first-level contact 654 is formed upon the source of the first pass transistor and electrically coupled to the source of the first pass transistor.

A second pass transistor of the first ROM cell is formed at the cross point of the first gate region 602 and the active region 615. A third pass transistor of the first ROM cell is formed at the cross point of the first gate region 602 and the active region 616. The first pass transistor, the second pass transistor and the third pass transistor are connected in parallel so as to form the pass transistor of Cell 1.

The structure of other ROM cells of the ROM array 600 is similar to Cell 1, and hence is not discussed in further detail herein. As shown in FIG. 6, there is a first isolation transistor formed between the two ROM cells (Cell 1 and Cell 3) of the first column of the ROM array 600. The first isolation transistor may be formed by three isolation transistor connected in parallel. Each isolation transistor is formed at the cross point of the third gate region 603 and an active region (e.g., active region 612). It should be noted that in accordance with an embodiment, the first drain/source region of the isolation transistor is coupled to the drain of the pass transistor of Cell 3. Likewise, the second drain/source region of the isolation transistor is coupled to the drain of the pass transistor of Cell 1.

Each ROM cell of the ROM array 600 is of a single contact structure. There may be two interconnect layers M1 and M2 formed over the substrate of the ROM array 600. As shown in FIG. 6, the first interconnect layer M1 is represented by a dashed rectangle. Bit lines BL (e.g., a first BL 614), bit lines BLB (e.g., a first BLB 618) and a second VSS line 620 of the ROM array 600 are formed in the first interconnect layer M1. In comparison with traditional ROM cell fabrication techniques having bit lines formed in an upper interconnect layer such as a second interconnect layer M2, the structure shown in FIG. 6 can further reduce coupling capacitance by forming the bit lines (e.g., BL 614 and BLB 618) in the first interconnect layer M1. One advantageous feature of having reduced coupling capacitance at the bit lines (e.g., BL 614 and BLB 618) is the sensing speed and function of the ROM array 600 can be improved as a result.

The first VSS lines 652 and 654 of the ROM array 600 are formed in the first-level contacts. As shown in FIG. 6, the first VSS line (e.g., VSS line 654 or 652) is of a length more than two times the horizontal length of a single ROM cell (e.g., Cell 1). The second VSS line 620 is formed in the first interconnect layer. The second VSS line 620 is of a length more than two times the vertical length of a single ROM cell (e.g., Cell 1). As shown in FIG. 6, the second VSS line is orthogonal to the first VSS line (e.g., the first VSS line 654). In addition, the first VSS lines 652 and 654 are electrically coupled to the second VSS line 620 through a plurality of first vias. One advantageous feature of having the second VSS line 620 is that the second VSS line 620 helps to further reduce the voltage drop so as to improve the speed and function of ROM cells.

The second interconnect layer M2 is represented by a dash-dotted rectangle. The word lines of the ROM array 600 are formed in the second interconnect layer M2. The word lines of the ROM array 600 may be coupled to the gate of a pass transistor through a variety of interconnect components such as a word line strap structure. The detailed description of the word line strap structure will be described below with respect to FIG. 8.

According to the schematic diagram shown in FIG. 1, the logic state of a ROM cell is determined by a connection between the drain of a pass transistor and its corresponding bit lines (BL or BLB). In FIG. 6, such a connection is implemented by a first-level contact (e.g., first level contact 646) and a first via (e.g., first via 676). Throughout the description, the first via formed upon the drain of a pass transistor is alternatively referred to as a coding layer of a ROM cell.

Each ROM cell of the ROM array 600 is programmed with either a logic state of "0" or a logic state of "1" through a coding layer. In particular, the coding layer is implemented by a first-level via (e.g., first-level via 676). According to an embodiment, when a drain of a pass transistor is connected to a bit line BL through a conductive path formed by a first-level contact and a first via, a logic state of "1" is stored in the pass transistor. On the other hand, when a drain of a pass transistor is connected to a bit line BLB through a conductive path formed by a first-level contact and a first via, a logic state of "0" is stored in the pass transistor.

As shown in FIG. 6, the drain of the pass transistor of Cell 1 is coupled to the bit line BLB 618. As a result, a logic state of "0" is stored in Cell 1. Likewise, there is a logic state of "0" is stored in Cell 2 since the drain of the pass transistor of Cell 2 is coupled to the bit line BLB 638. By contrast, a logic state of "1" is stored in both Cell 3 and Cell 4 since the pass transistors of Cell 3 and Cell 4 are coupled to the bit line BL 614 and the bit line BL 634 respectively.

Figure 7:
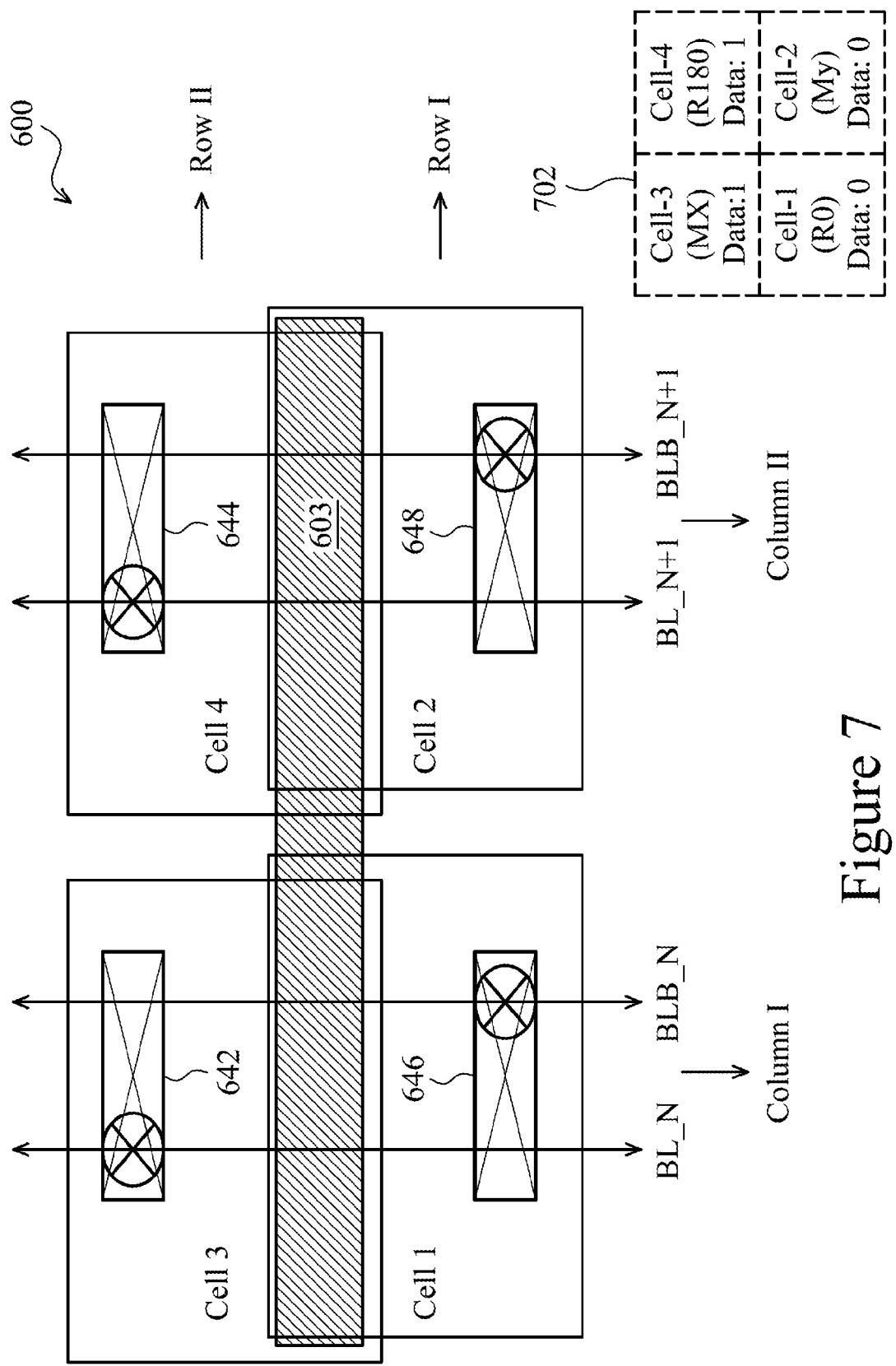
FIG. 7 illustrates a simplified layout diagram of the ROM array shown in FIG. 6 in accordance with an embodiment.

FIG. 7 illustrates a simplified layout diagram of the ROM array shown in FIG. 6 in accordance with an embodiment. The ROM array 600 has two columns and two rows. For simplicity, FIG. 7 only illustrates the first-level contacts (e.g., first-level contact 646) coupled to the drains of the pass transistors of the ROM array 600. Two adjacent pass transistors may be separated by an isolation transistor. As shown in FIG. 7, the pass transistor of Cell 1 and the pass transistor of Cell 3 share a first isolation transistor. Likewise, the pass transistor of Cell 2 and the pass transistor of Cell 4 share a second isolation transistor.

The ROM array 600 may comprise four ROM cells. In accordance with an embodiment, there is a coding via formed over the first-level contact 646 at Cell 1. As a result, there is a connection between the drain of the pass transistor of Cell 1 and the bit line BLB_N. According to a definition of ROM cells, a logic state of "0" is stored at Cell 1. Likewise, Cell 2 is of a logic state of "0" because there is a coding via coupled between the first-level contact 648 and the bit line BLB_N+1. In contrast, a coding via is formed between the first level contacts (e.g., first level contacts 642 and 644) and the bit lines BL at Cell 3 and Cell 4. Therefore, a logic state of "1" is stored at both Cell 3 and Cell 4. A table 702 illustrates in detail the logic state of each ROM cell of the ROM array 600.

Figure 8:
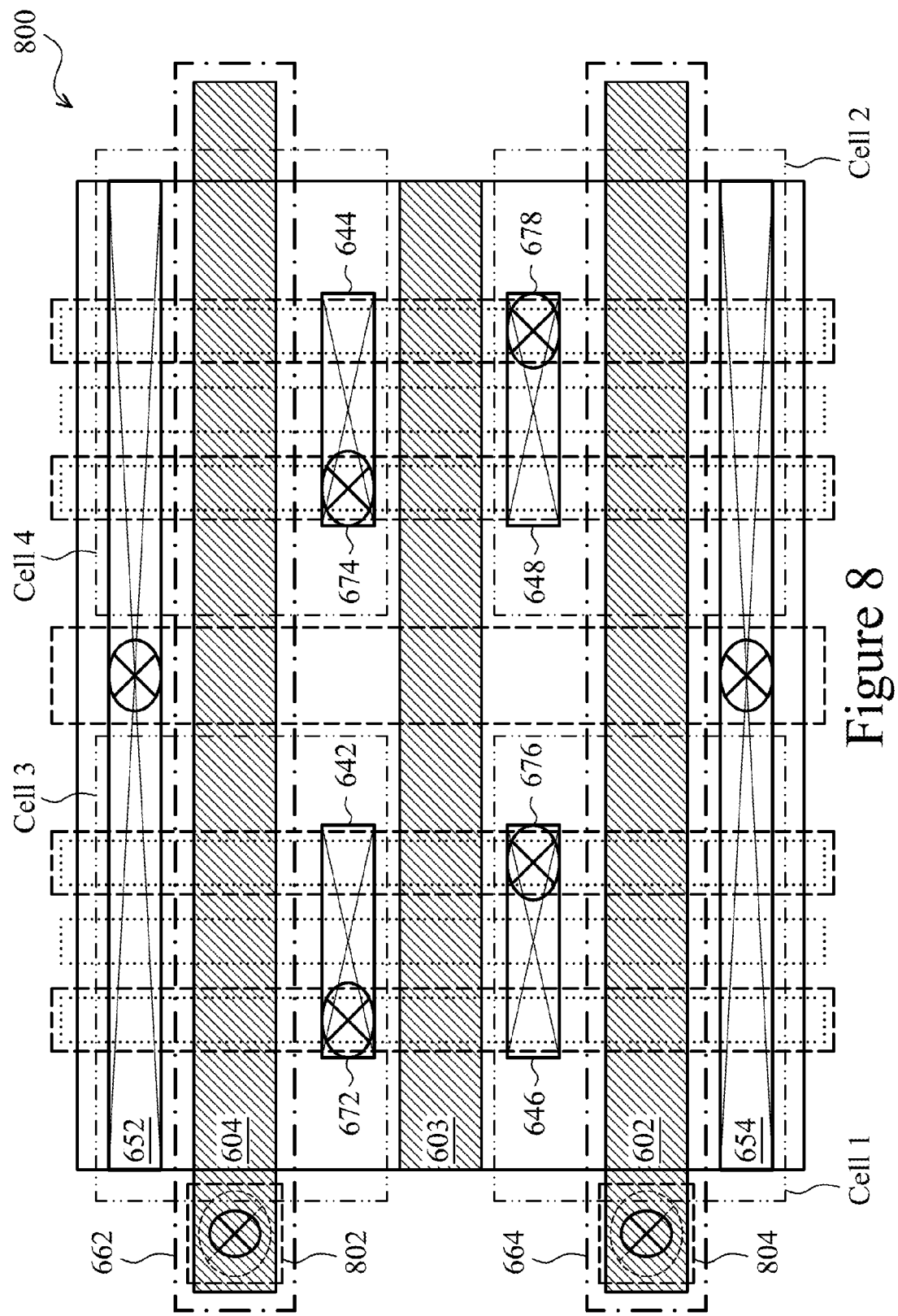
FIG. 8 illustrates a layout diagram of a ROM array in accordance with another embodiment.

FIG. 8 illustrates a layout diagram of a ROM array in accordance with another embodiment. The ROM array 800 of FIG. 8 is similar to the ROM array 600 shown in FIG. 6 except that a word line strap structure is employed to further improve the function and speed of the ROM array 800. As shown in FIG. 8, for each ROM cell (e.g., Cell 1) of the ROM array 800, there may be three fin structures protruding over the surface of the substrate. Three pass transistors are formed as a result. These three pass transistors may connect in parallel to form the pass transistor of the ROM cell (e.g., Cell 1).

The word line strap structure 804 comprises a gate contact, a first via, a first metal line and a second via (not shown respectively but illustrated in FIG. 5). The word line strap structure 804 provides a low voltage drop electrical connection from a word line formed in the second interconnect layer M2 and the gates of the pass transistors of Cell 1. In addition, two horizontally adjacent pass transistors may share a single word line strap structure. As shown in FIG. 8, Cell 1 and Cell 2 are horizontally adjacent to each other. Despite that the word line strap structure 804 is formed in Cell 1, both Cell 1 and Cell 2 may share the word line strap structure 804. In other words, the word line structure 804 provides a low voltage drop and high speed connection path between the word line and its corresponding gates located in Cell 1 and Cell 2.

Figure 9:
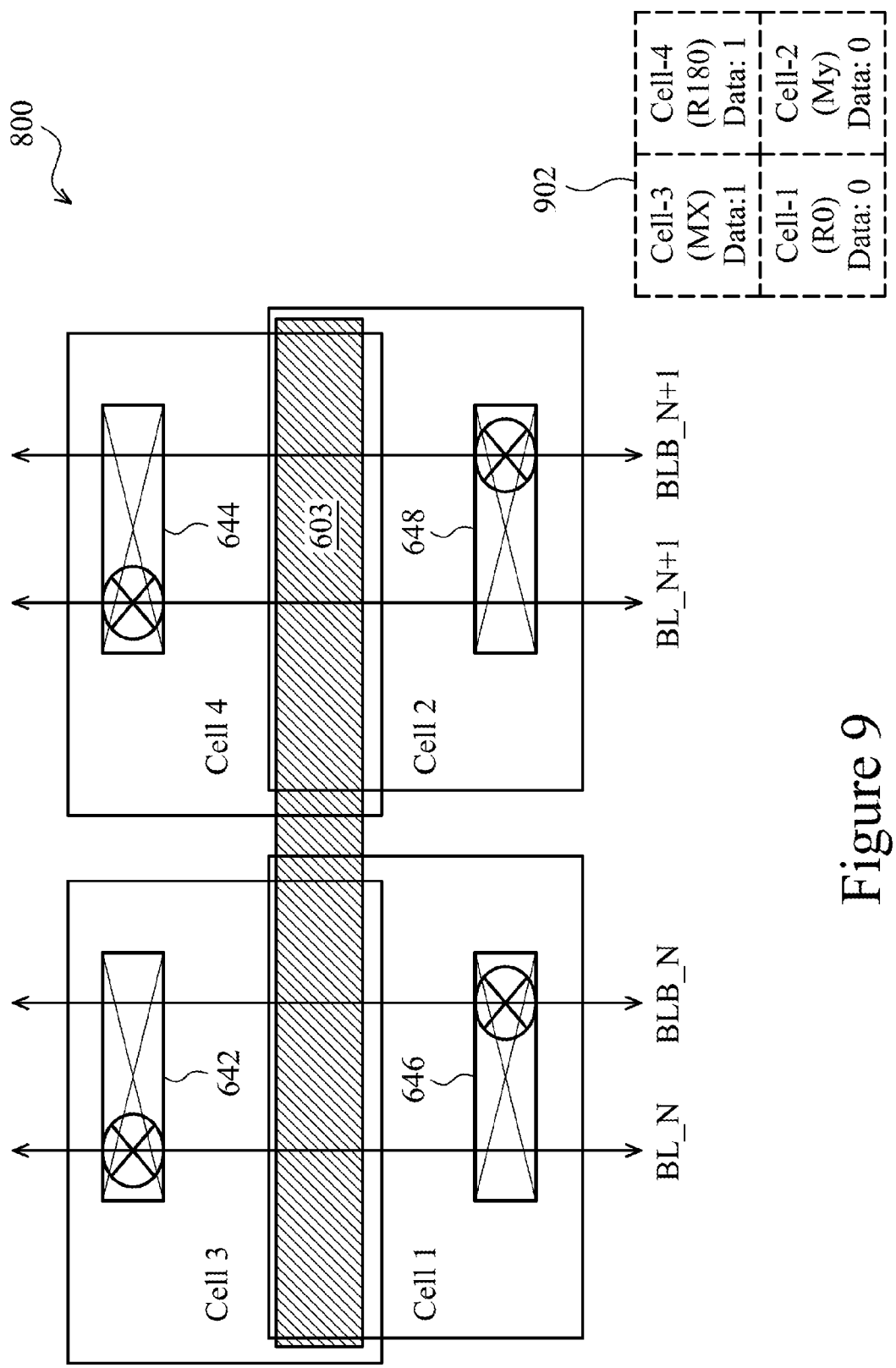
FIG. 9 illustrates a simplified layout diagram of the ROM array shown in FIG. 8 in accordance with an embodiment.

FIG. 9 illustrates a simplified layout diagram of the ROM array shown in FIG. 8 in accordance with an embodiment. The ROM array 800 has two columns and two rows. Two adjacent pass transistors may be separated by an isolation transistor. As shown in FIG. 7, the pass transistor of Cell 1 and the pass transistor of Cell 3 share a first isolation transistor. Likewise, the pass transistor of Cell 2 and the pass transistor of Cell 4 share a second isolation transistor.

The ROM array 800 may comprise four ROM cells. In accordance with an embodiment, there is a coding via formed over the first-level contact 646 at Cell 1. As a result, there is a connection between the drain of the pass transistor of Cell 1 and the bit line BLB_N. According to a definition of ROM cells, a logic state of "0" is stored at Cell 1. Likewise, Cell 2 is of a logic state of "0" because there is a coding via coupled between the first-level contact 648 and the bit line BLB_N+1. In contrast, a coding via is formed between the first level contacts (e.g., first level contacts 642 and 644) and the bit lines BL at Cell 3 and Cell 4. Therefore, a logic state of "1" is stored at Cell 3 and Cell 4. A table 902 illustrates in detail the logic state of each ROM cell of the ROM array 800.

Figure 10:
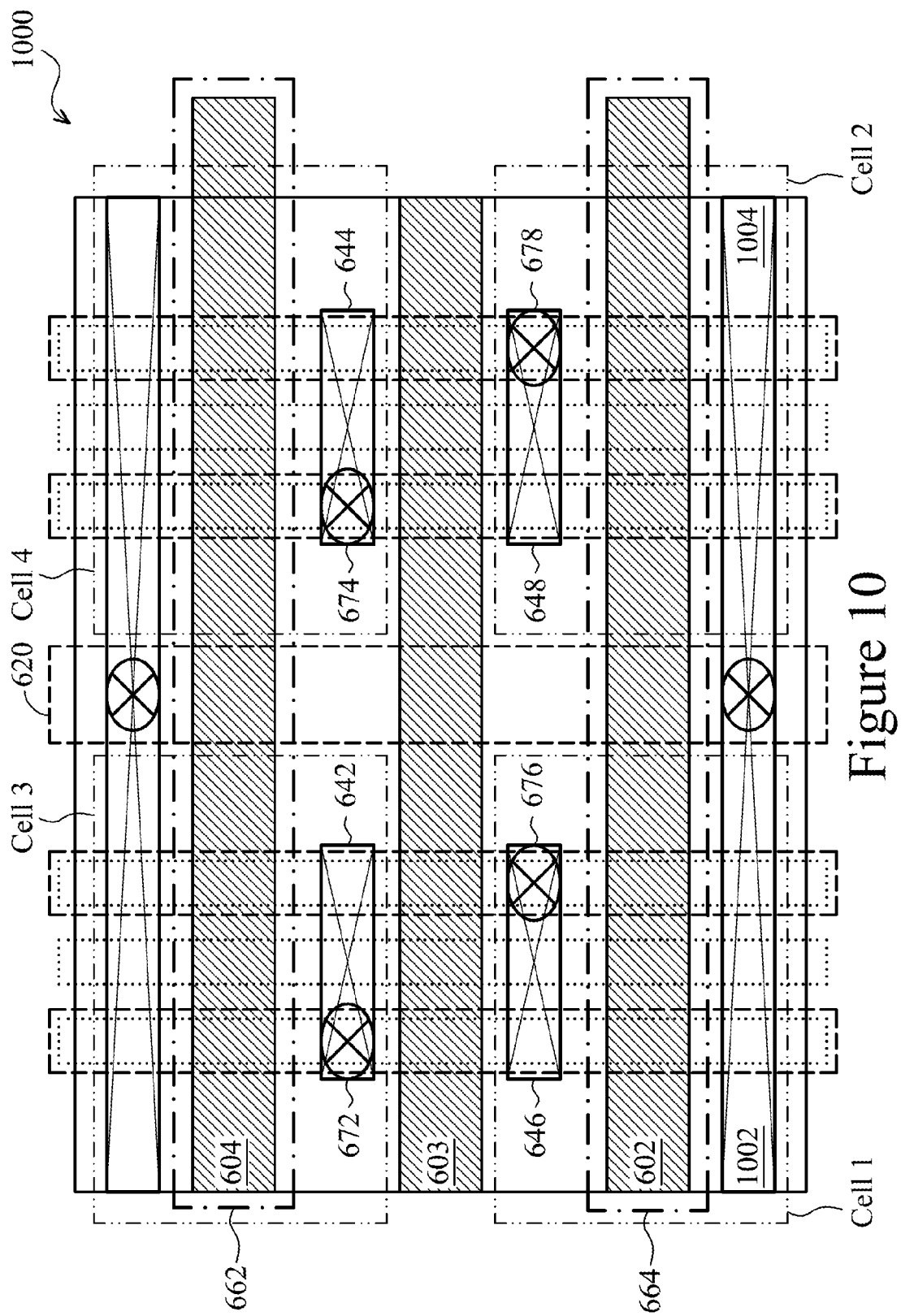
FIG. 10 illustrates a layout diagram of a ROM array in accordance with another embodiment.

FIG. 10 illustrates a layout diagram of a ROM array in accordance with another embodiment. The ROM array 1000 of FIG. 10 is similar to the ROM array 600 shown in FIG. 6 except that a third VSS line 1004 is employed to further improve the function and speed of the ROM array 1000. As shown in FIG. 10, a first VSS line 1002 provides a ground potential for Cell 1. Likewise, the third VSS line 1004 provides a ground potential for Cell 2. The third VSS line 1004 is orthogonal to the second VSS line 620. Furthermore, both the first VSS line 1002 and the third VSS line 1004 are electrically coupled to the second VSS line 620 through a first via shown in FIG. 10.

Figure 11:
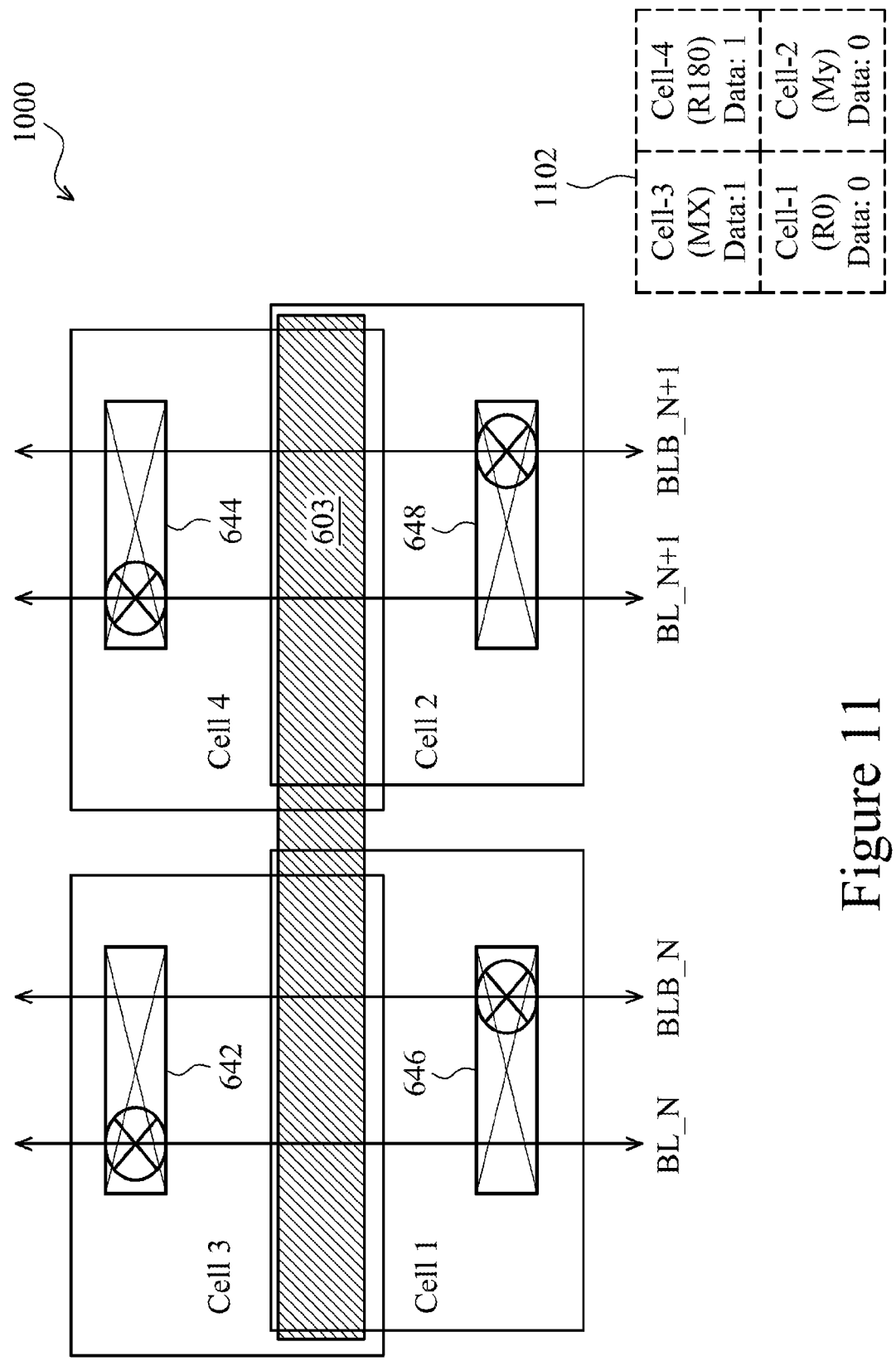
FIG. 11 illustrates a simplified layout diagram of the ROM array shown in FIG. 10 in accordance with an embodiment.

FIG. 11 illustrates a simplified layout diagram of the ROM array shown in FIG. 10 in accordance with an embodiment. The ROM array 1000 has two columns and two rows. Two adjacent pass transistors may be separated by an isolation transistor. As shown in FIG. 11, the pass transistor of Cell 1 and the pass transistor of Cell 3 share a first isolation transistor. Likewise, the pass transistor of Cell 2 and the pass transistor of Cell 4 share a second isolation transistor.

The ROM array 1000 may comprise four ROM cells. In accordance with an embodiment, there is a coding via formed over the first-level contact 646 at Cell 1. As a result, there is a connection between the drain of the pass transistor of Cell 1 and the bit line BLB_N. According to a definition of ROM cells, a logic state of "0" is stored at Cell 1. Likewise, Cell 2 is of a logic state of "0" because there is a coding via coupled between the first-level contact 648 and the bit line BLB_N+1. In contrast, a coding via is formed between the first level contacts (e.g., first level contacts 642 and 644) and the bit lines BL at Cell 3 and Cell 4. Therefore, a logic state of "1" is stored at Cell 3 and Cell 4. A table 1102 illustrates in detail the logic state of each ROM cell of the ROM array 1000.

Figure 12:
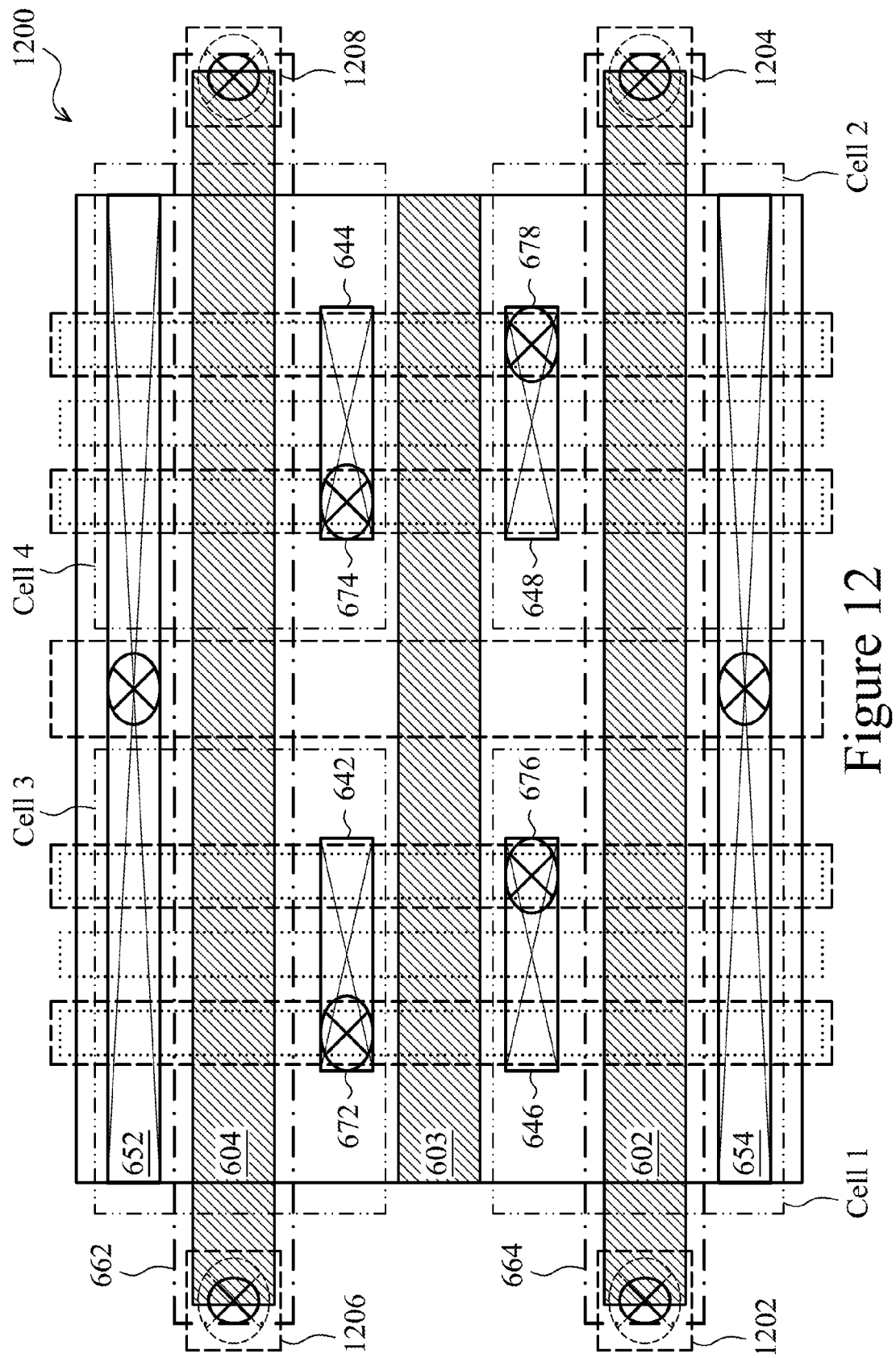
FIG. 12 illustrates a layout diagram of a ROM array in accordance with another embodiment.

FIG. 12 illustrates a layout diagram of a ROM array in accordance with another embodiment. The ROM array 1200 of FIG. 12 is similar to the ROM array 600 shown in FIG. 6 except that that a word line strap structure is employed to further improve the function and speed of the ROM array 1200. As shown in FIG. 12, a first word line structure 1202 provides a low voltage drop electrical connection from a word line formed in the second interconnect layer M2 and the gates of the pass transistors of Cell 1. Likewise, word line structures 1204, 1206 and 1208 provide low voltage drop electrical connection paths for Cell 2, Cell 3 and Cell 4 respectively.

Figure 13:
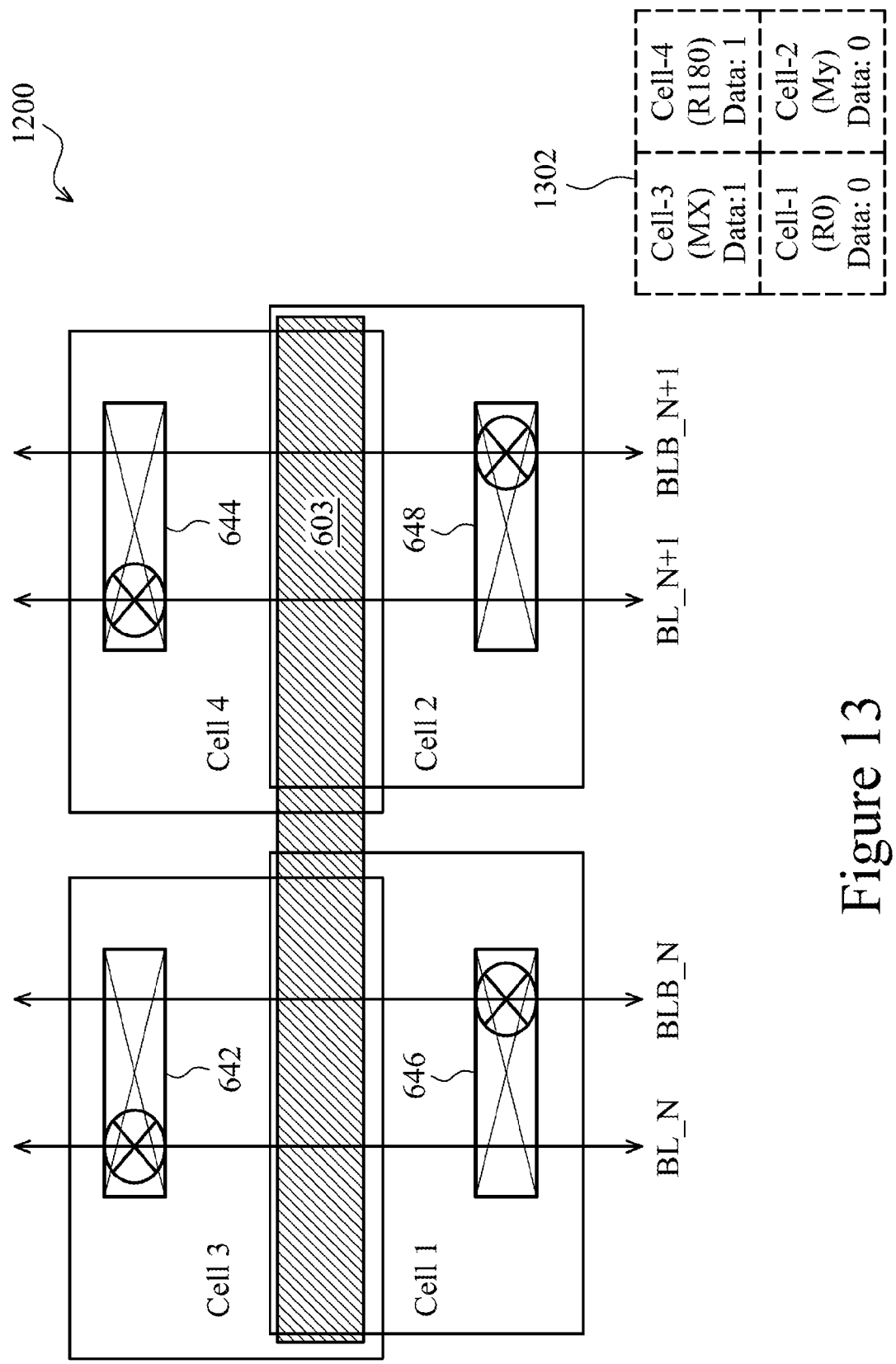
FIG. 13 illustrates a simplified layout diagram of the ROM array shown in FIG. 12 in accordance with an embodiment.

FIG. 13 illustrates a simplified layout diagram of the ROM array shown in FIG. 12 in accordance with an embodiment. The ROM array 1200 has two columns and two rows. The ROM array 1200 may comprise four ROM cells. In accordance with an embodiment, there is a coding via formed over the first-level contact 646 at Cell 1. As a result, there is a connection between the drain of the pass transistor of Cell 1 and the bit line BLB_N. According to a definition of ROM cells, a logic state of "0" is stored at Cell 1. Likewise, Cell 2 is of a logic state of "0" because there is a coding via coupled between the first-level contact 648 and the bit line BLB_N+1. In contrast, a coding via is formed between the first level contacts (e.g., first level contacts 642 and 644) and the bit lines BL at Cell 3 and Cell 4. Therefore, a logic state of "1" is stored at Cell 3 and Cell 4. A table 1302 illustrates in detail the logic state of each ROM cell of the ROM array 1200.

Figure 14:
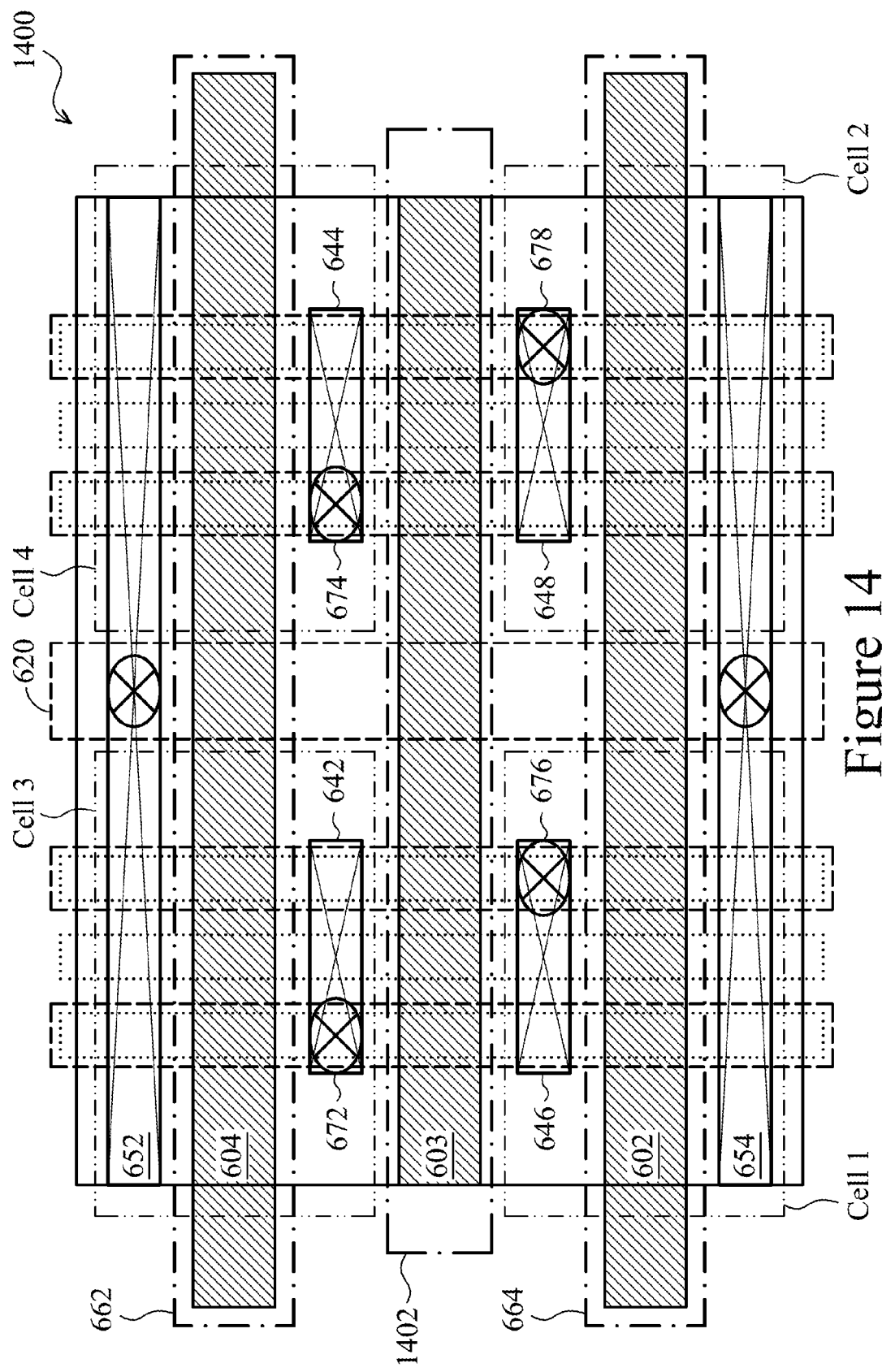
FIG. 14 illustrates a layout diagram of a ROM array in accordance with another embodiment.

FIG. 14 illustrates a layout diagram of a ROM array in accordance with another embodiment. The ROM array 1400 of FIG. 14 is similar to the ROM array 600 shown in FIG. 6 except that that a third VSS line is employed to further improve the function and speed of the ROM array 1400. As shown in FIG. 14, a third VSS line 1402 is formed in the second interconnect layer. In addition, the third VSS line 1402 is orthogonal to the second VSS line 620. The third VSS line 1402 is electrically coupled to the second VSS line 620.

Figure 15:
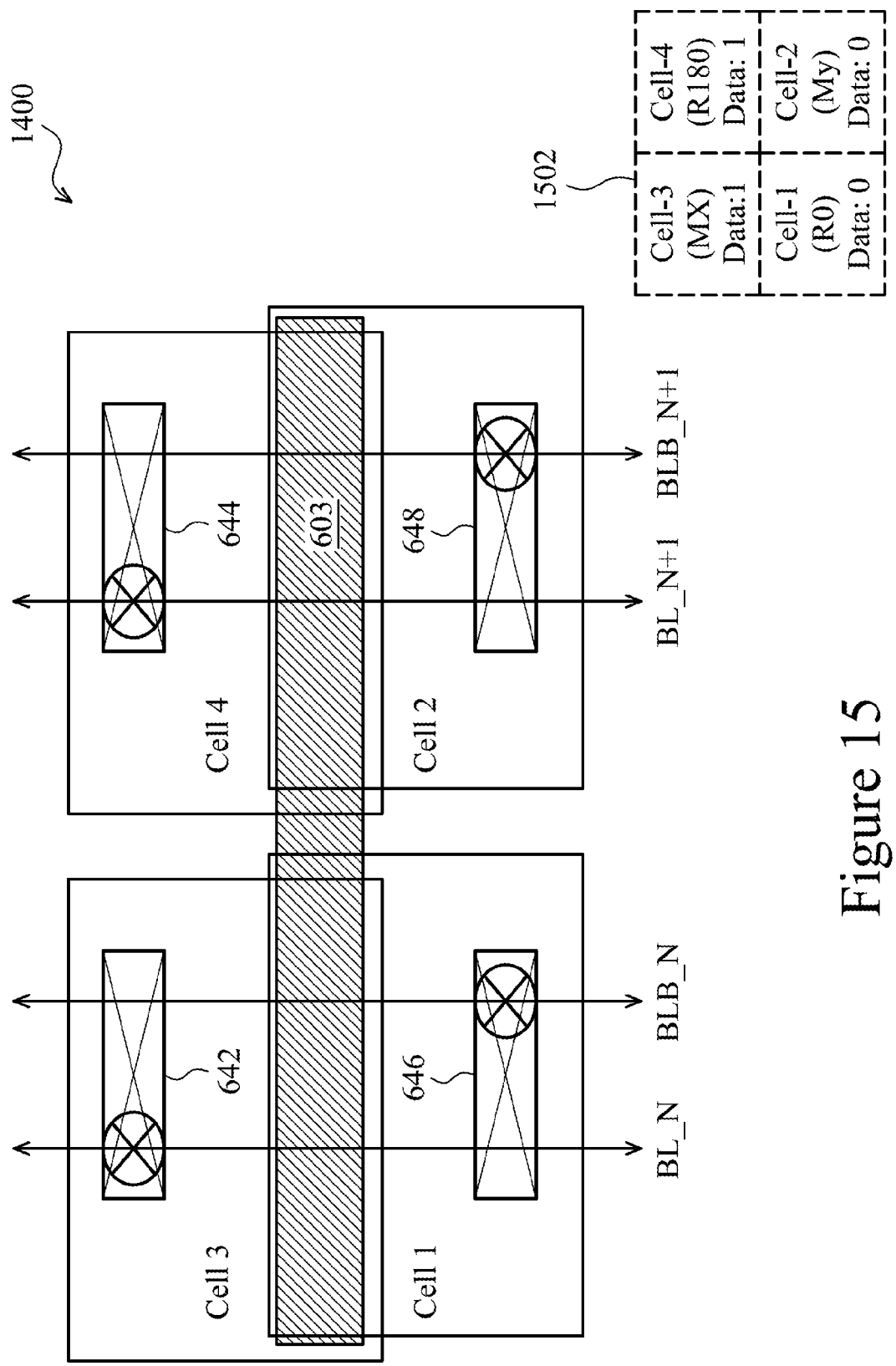
FIG. 15 illustrates a simplified layout diagram of the ROM array shown in FIG. 14 in accordance with an embodiment.

FIG. 15 illustrates a simplified layout diagram of the ROM array shown in FIG. 14 in accordance with an embodiment. The ROM array 1400 has two columns and two rows. The ROM array 1400 may comprise four ROM cells. In accordance with an embodiment, there is a coding via formed over the first-level contact 646 at Cell 1. As a result, there is a connection between the drain of the pass transistor of Cell 1 and the bit line BLB_N. According to a definition of ROM cells, a logic state of "0" is stored at Cell 1. Likewise, Cell 2 is of a logic state of "0" because there is a coding via coupled between the first-level contact 648 and the bit line BLB_N+1. In contrast, a coding via is formed between the first level contacts (e.g., first level contacts 642 and 644) and the bit lines BL at Cell 3 and Cell 4. Therefore, a logic state of "1" is stored at Cell 3 and Cell 4. A table 1402 illustrates in detail the logic state of each ROM cell of the ROM array 1400.

Figure 16:
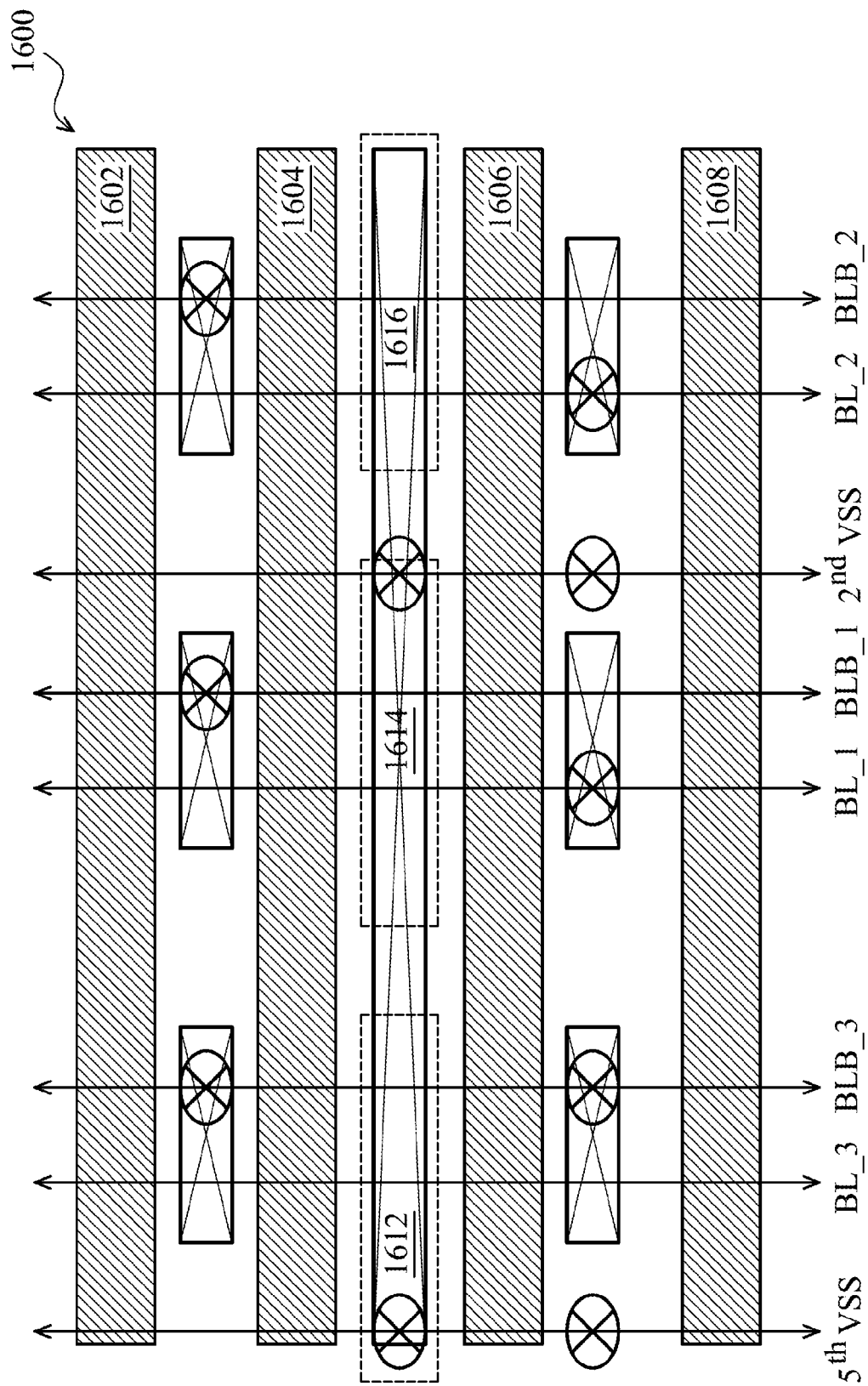
FIG. 16 illustrates a layout diagram of a three-column and two-row ROM array in accordance with an embodiment.

FIG. 16 illustrates a layout diagram of a three-column and two-row ROM array in accordance with an embodiment. The ROM array 1600 of FIG. 16 is similar to the ROM array 600 shown in FIG. 6 except that that a fourth VSS line and a fifth VSS line are employed to further improve the function and speed of the ROM array 1600. As shown in FIG. 16, a second VSS line is formed between the second column and the third column of the ROM array 1600. A fifth VSS line is formed adjacent to the first column of the Rom array 1600. In sum, there is a vertical VSS line (e.g., the second VSS line) formed between two adjacent columns of the ROM array 1600.

FIG. 16 further illustrates another three VSS lines. A first VSS line 1614 is formed in a first-level contact. The third VSS line 1616 and the fourth VSS line 1612 are formed the first-level contact and electrically coupled to the first VSS line 1614. As shown in FIG. 16, the second VSS line and the fifth VSS line are formed in a first direction. The first VSS line, the third VSS line and the fourth VSS line are formed in the second direction. The first direction is orthogonal to the second direction. It should be noted that all five VSS lines shown in FIG. 16 are electrically coupled to each other.

Figure 17:
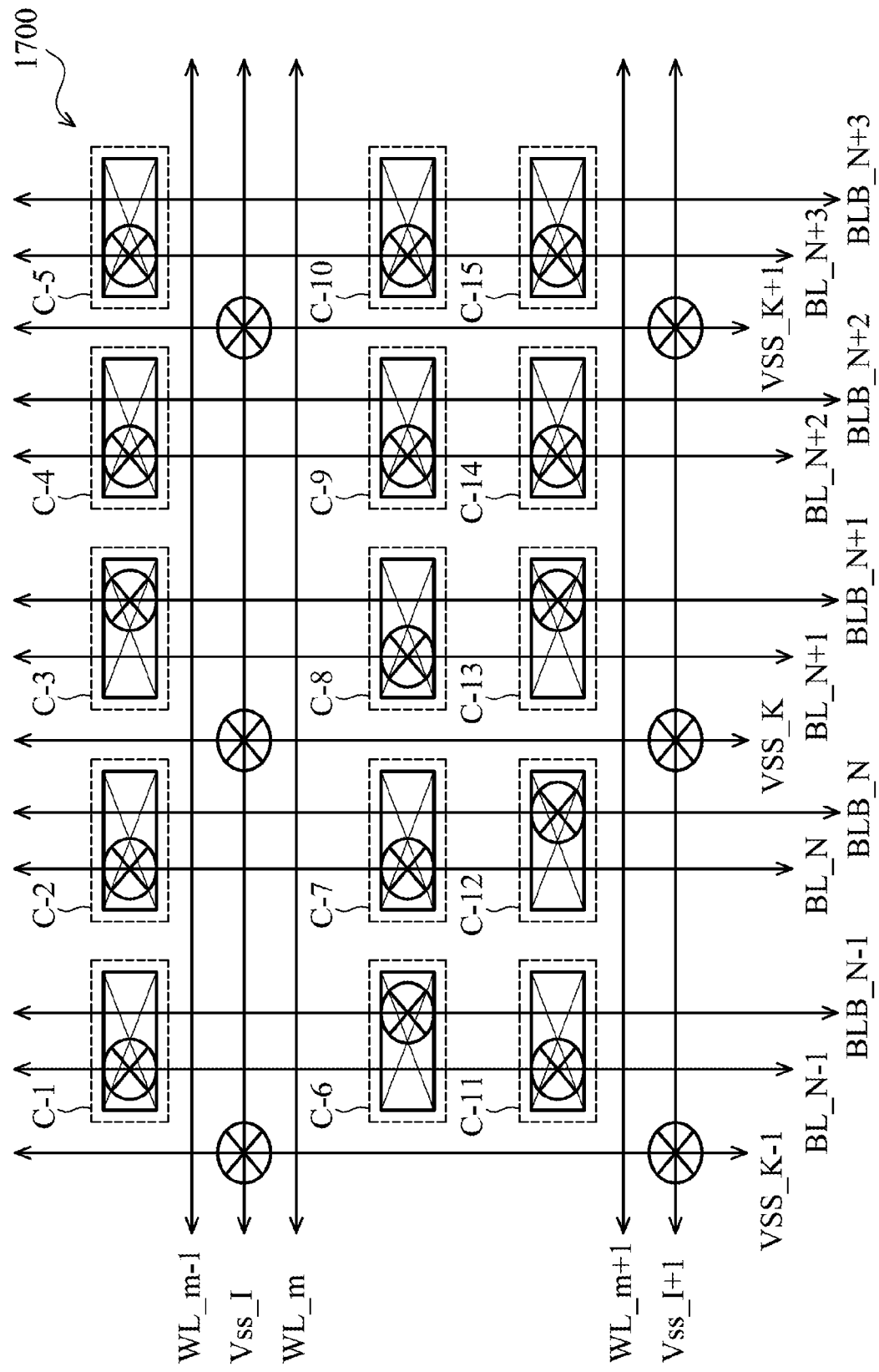
FIG. 17 illustrates a layout diagram of a ROM array of five columns and three rows in accordance with an embodiment.

FIG. 17 illustrates a layout diagram of a ROM array of five columns and three rows in accordance with an embodiment. Each ROM cell of FIG. 17 is similar to the ROM cell 600 shown in FIG. 6, and hence is not discussed in further detail herein. The ROM array 1700 has five columns and three rows of ROM cells. As shown in FIG. 17, two vertically adjacent columns share a vertical VSS line. For example, the second column includes ROM cell C-2, ROM cell C-7 and ROM cell C-12. The third column includes ROM cell C-3, ROM cell C-8 and ROM cell C-13. A vertical VSS line VSS_K is shared by the second column and the third column as shown in FIG. 17.

FIG. 18 illustrates the logic state of each ROM cell of the ROM array shown in FIG. 17. A table 1802 illustrates the logic state of each ROM cell. Referring back to FIG. 17, a first via of the first ROM cell C-1 is connected between a first-level contact and a bit line BL. As a result, a logic state of "1" is stored in the first Rom cell C-1. Likewise, the logic state of other ROM cells can be determined by the same principle. The table 1802 illustrates in detail the logic state of each ROM cell of the ROM array 1700 shown in FIG. 17.

Figure 19:
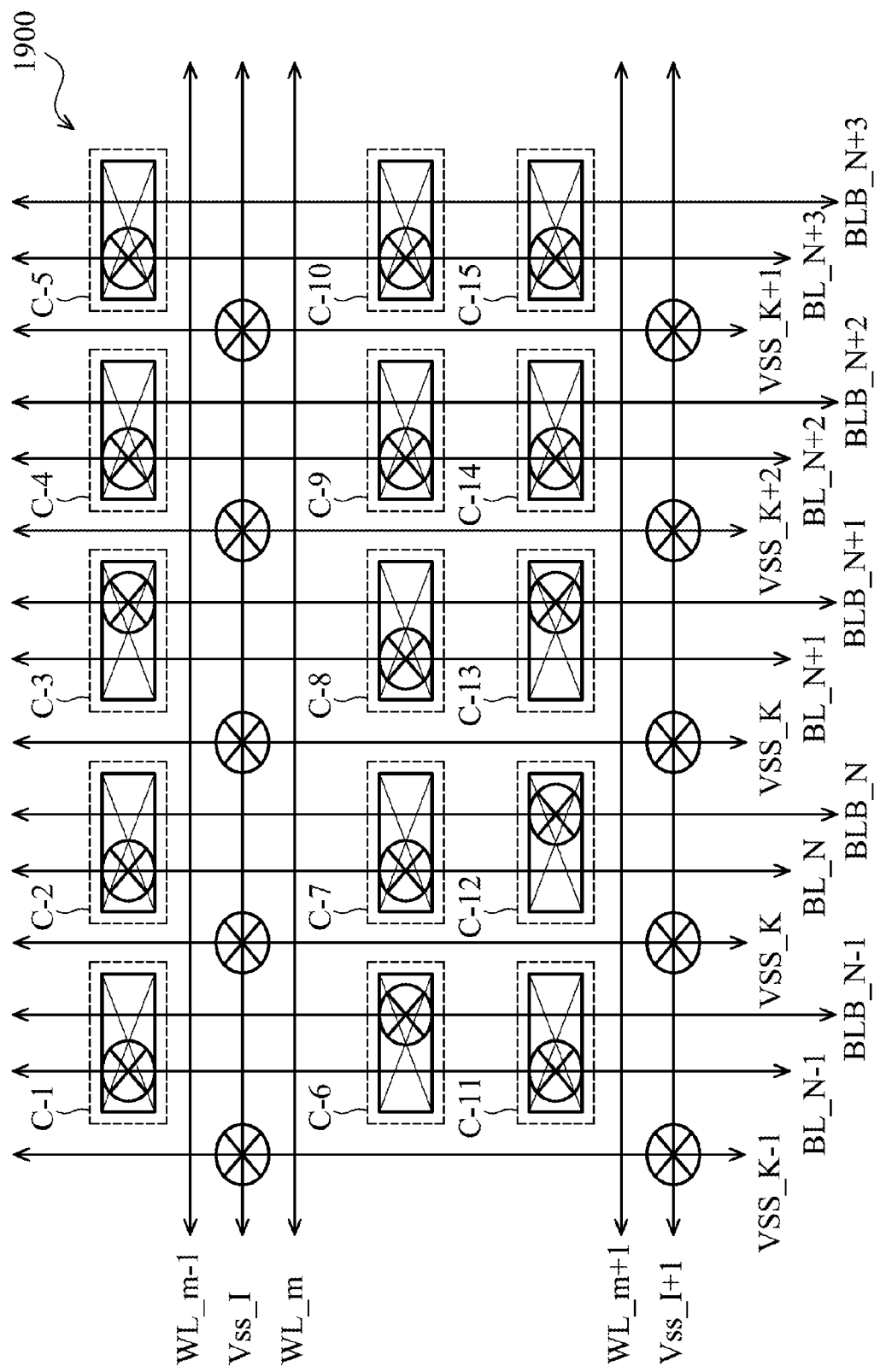
FIG. 19 illustrates a layout diagram of a ROM array of five columns and three rows in accordance with another embodiment.

FIG. 19 illustrates a layout diagram of a ROM array of five columns and three rows in accordance with another embodiment. Each ROM cell of FIG. 19 is similar to the ROM cell 600 shown in FIG. 6, and hence is not discussed in further detail herein. The ROM array 1900 has five columns and three rows of ROM cells. The ROM array 1900 is similar to the ROM array 1700 shown in FIG. 17 except that two additional VSS lines are added in comparison with the VSS line configuration of FIG. 17. As shown in FIG. 19, a vertical VSS line is formed between two vertically adjacent columns. For example, the vertical VSS line VSS_K is formed between the first column and the second column. Likewise, the vertical VSS line VSS_K+2 is formed between the third column and the fourth column.

Figure 20:
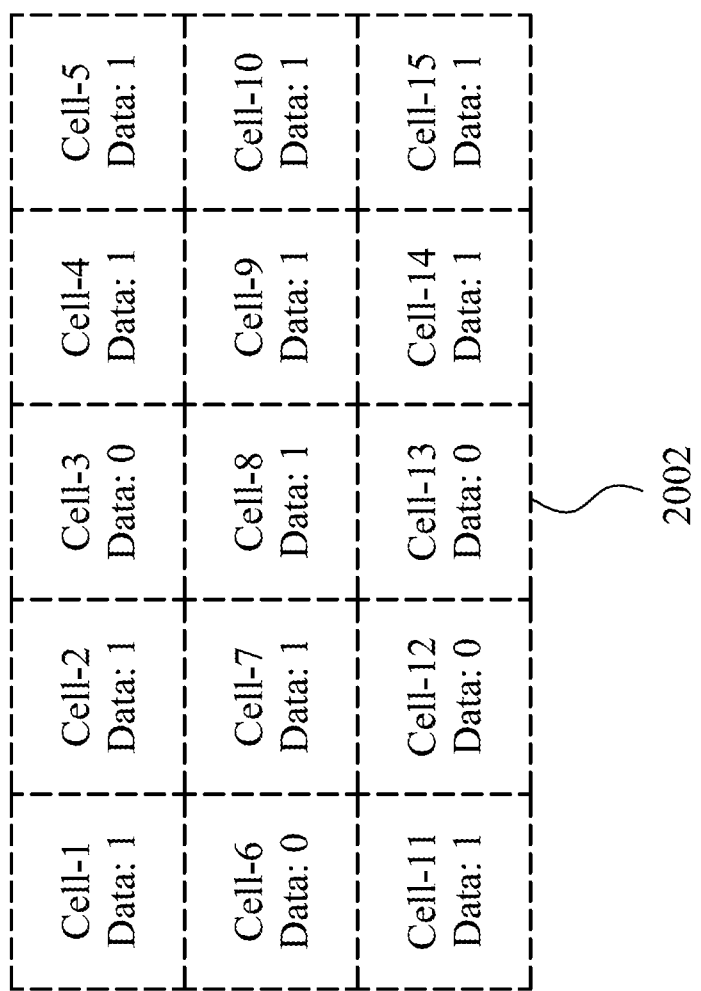
FIG. 20 illustrates the logic state of each ROM cell of the ROM array shown in FIG. 19.

FIG. 20 illustrates the logic state of each ROM cell of the ROM array shown in FIG. 19. The table 2002 illustrates in detail the logic state of each ROM cell of the ROM array 1900 shown in FIG. 19. The method of determining the logic state of each ROM cell has been described above with respect to FIG. 18, and hence is not discussed in further detail to avoid repetition.

Figure 21:
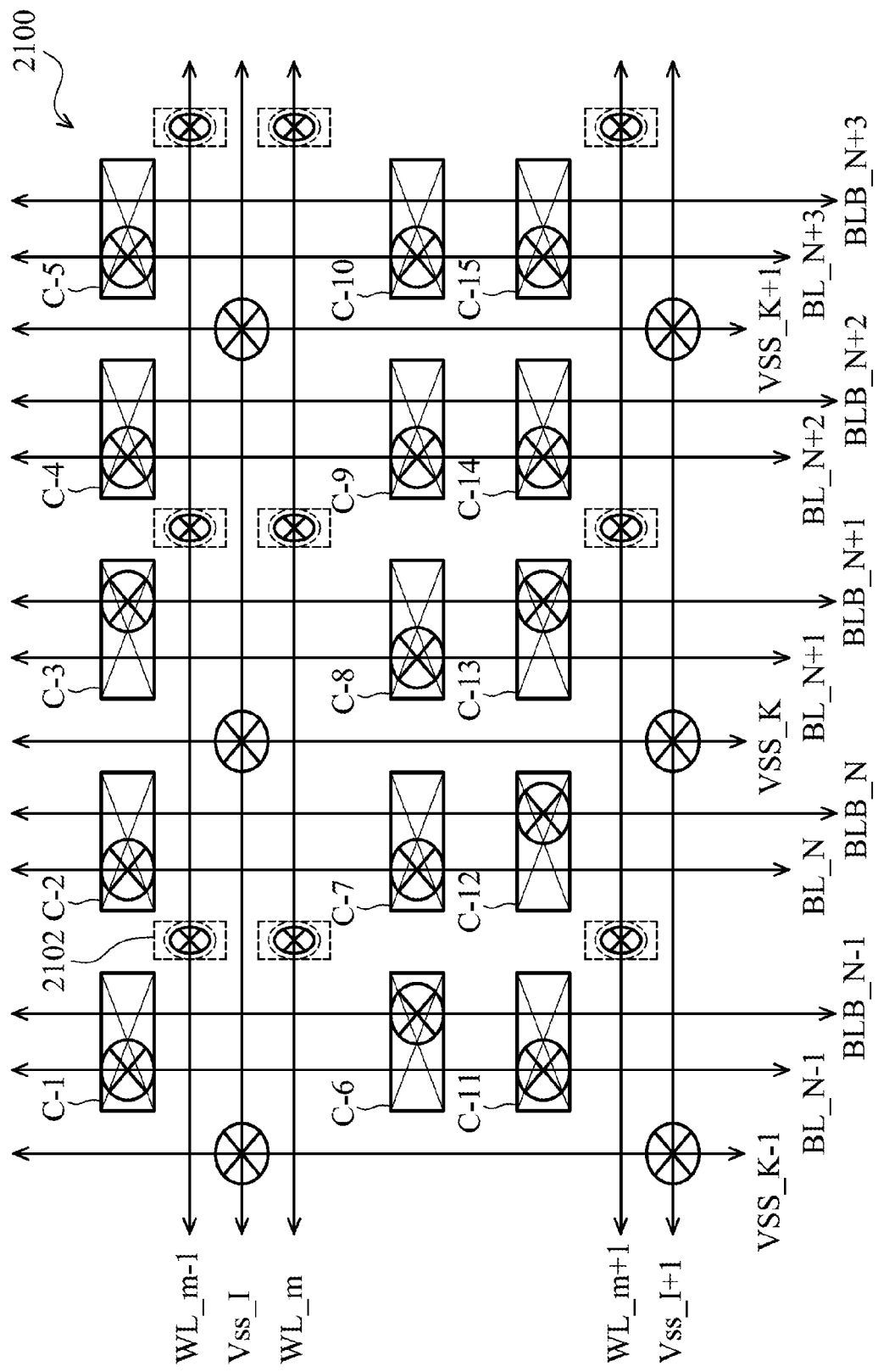
FIG. 21 illustrates a layout diagram of a ROM array of five columns and three rows in accordance with another embodiment.

FIG. 21 illustrates a layout diagram of a ROM array of five columns and three rows in accordance with another embodiment. The ROM array 2100 is similar to the ROM array 1700 shown in FIG. 17 except that a word line strap structure is formed between two horizontally adjacent ROM cells. As shown in FIG. 21, a word line strap structure 2102 is formed between ROM cell C-1 and ROM cell C-2. The word line strap structure 210 provides a low voltage drop connection between word line WL_m$^{-1}$ and the gates of ROM cell C-1 and ROM cell C-2.

FIG. 22 illustrates the logic state of each ROM cell of the ROM array shown in FIG. 21. The table 2202 illustrates in detail the logic state of each ROM cell of the ROM array 2100 shown in FIG. 21. The method of determining the logic state of each ROM cell has been described above with respect to FIG. 18, and hence is not discussed in further detail to avoid repetition.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
a fin structure over a substrate;
a gate wrapping the fin structure around three sides of the fin structure;
a first VSS line in a contact layer overlying the substrate;
a first bit line in a first interconnect layer overlying the contact layer;
a second bit line in the first interconnect layer, wherein the second bit line is in parallel with the first bit line;
a word line in a second interconnect layer overlying the first interconnect layer; and
a word line strap structure comprising:
    a gate contact in the contact layer;
    a first via in the first interconnect layer:
    a first metal line in the first interconnect layer, wherein the first metal line is over the first via; and
    a second via in the second interconnect layer, wherein the word line is over the second via.

2. The device of claim 1, wherein:
the fin structure comprises a drain, a source and a channel coupled between the drain and the source.

3. The device of claim 2, wherein:
the source is connected to the first VSS line; and
the drain is coupled to the first bit line through a coding layer.

4. The device of claim 3, wherein:
the coding layer is formed by a first contact and a first via, and wherein the first via is in the first interconnect layer and underneath the first bit line.

5. The device of claim 1, further comprising:
a second VSS line in the first interconnect layer, wherein the second VSS line is parallel with the first bit line.

6. The device of claim 5, further comprising:
a third VSS line in the second interconnect layer, wherein the third VSS line is electrically coupled to the second VSS line.

7. The device of claim 6, wherein:
the third VSS line is in parallel with the word line.

8. A memory cell comprising:
a memory transistor comprising a drain, a source, a gate, and a channel coupled between the drain and the source;
a first VSS line in a contact layer overlying a substrate;
a first bit line in a first interconnect layer overlying the contact layer;
a second bit line in the first interconnect layer, wherein the second bit line is in parallel with the first bit line;
a second VSS line in the first interconnect layer, wherein the second VSS line is in parallel with first bit line;
a word line in a second interconnect layer overlying the first interconnect layer;
a third VSS line in the second interconnect layer, wherein the third VSS line is in parallel with the word line; and
a word line strap structure coupled between the gate and the word line.

9. The memory cell of claim 8, wherein the word line strap structure comprises:
a gate contact in the contact layer;
a first via in the first interconnect layer:
a first metal line in the first interconnect layer, wherein the first metal line is over the first via; and
a second via in the second interconnect layer, wherein the word line is over the second via.

10. The memory cell of claim 8, wherein:
the second VSS line is electrically coupled to the first VSS line through a first via in the first interconnect layer.

11. The memory cell of claim 8, wherein:
the third VSS line is electrically coupled to the second VSS line.

12. The memory cell of claim 8, wherein:
the drain is electrically coupled to the first bit line; and
the source is electrically coupled to the first VSS line.

13. The memory cell of claim 8, wherein:
the word line is of a direction orthogonal to a direction of the first bit line.

14. An apparatus comprising:
a plurality of interconnect structures over a substrate;
a gate in a contact layer over the substrate;
a first VSS line in the contact layer;
a first bit line in a first interconnect layer over the contact layer;
a second bit line in the first interconnect layer, wherein the second bit line is in parallel with the first bit line;
a second VSS line in the first interconnect layer, wherein the second VSS line is orthogonal to the first VSS line;
a word line in a second interconnect layer over the first interconnect layer;
a third VSS line in the second interconnect layer, wherein the third VSS line is in parallel with the word line; and
a word line strap structure coupled between the gate and the word line.

15. The apparatus of claim 14, wherein:
the first bit line is orthogonal to the first VSS line; and
the second bit line is orthogonal to the first VSS line.

16. The apparatus of claim 14, further comprising:
a drain, a source and channel between the drain and the source.

17. The apparatus of claim 16, wherein:
the drain is connected to the plurality of interconnect structures through a first contact and a second contact formed in the contact layer; and
the gate is connected the plurality of interconnect structures through a third contact formed in the contact layer.

18. The apparatus of claim 17, wherein:
a height of the gate is equal to a height of the first contact.

19. The apparatus of claim 17, wherein:
a height of the second contact is equal to a height of the third contact.

20. The apparatus of claim 14, wherein the word line strap structure comprises:
a gate contact in the contact layer;
a first via in the first interconnect layer:
a first metal line in the first interconnect layer, wherein the first metal line is over the first via; and
a second via in the second interconnect layer, wherein the word line is over the second via.

* * * * *